(12) United States Patent
Harada et al.

(10) Patent No.: US 7,923,685 B2
(45) Date of Patent: Apr. 12, 2011

(54) ELECTRON BEAM DEVICE

(75) Inventors: Ken Harada, Fuchu (JP); Hiroto Kasai, Higashimatsuyama (JP)

(73) Assignee: Hitachi, Ltd., Tokyo (JP)

(*) Notice: Subject to any disclaimer, the term of this patent is extended or adjusted under 35 U.S.C. 154(b) by 156 days.

(21) Appl. No.: 12/324,937

(22) Filed: Nov. 28, 2008

(65) Prior Publication Data

US 2009/0206256 A1 Aug. 20, 2009

(30) Foreign Application Priority Data

Feb. 15, 2008 (JP) ................................ 2008-033948

(51) Int. Cl.
*H01J 37/04* (2006.01)
(52) U.S. Cl. ......... 250/310; 250/306; 250/307; 250/311
(58) Field of Classification Search .................. 250/306, 250/307, 310, 311
See application file for complete search history.

(56) References Cited

U.S. PATENT DOCUMENTS

| 5,192,867 | A | * | 3/1993 | Osakabe et al. | ............... | 250/311 |
| 5,500,527 | A | * | 3/1996 | Zarubin | ............. | 850/9 |
| 7,538,323 | B2 | * | 5/2009 | Harada et al. | .................. | 250/310 |
| 7,655,905 | B2 | * | 2/2010 | Harada et al. | .................. | 250/306 |
| 7,750,298 | B2 | * | 7/2010 | Harada et al. | .................. | 250/311 |
| 2007/0272861 | A1 | * | 11/2007 | Harada et al. | .................. | 250/311 |
| 2009/0045339 | A1 | * | 2/2009 | Harada et al. | .................. | 250/311 |

FOREIGN PATENT DOCUMENTS

| EP | 0456219 A2 | 11/1991 |
| EP | 1426998 A2 | 6/2004 |
| JP | 10199464 A | 7/1998 |
| JP | 2005-197165 | 7/2005 |
| JP | 2006-216345 | 8/2006 |
| JP | 2006-313069 | 11/2006 |
| JP | 2007-115409 | 5/2007 |

OTHER PUBLICATIONS

European Search Report dated Jul. 17, 2009, issued in corresponding European Patent Application No. 08 02 0660.

* cited by examiner

*Primary Examiner* — Robert Kim
*Assistant Examiner* — Michael Maskell
(74) *Attorney, Agent, or Firm* — Brundidge & Stanger, P.C.

(57) ABSTRACT

A multi-biprism electron interferometer is configured so as to arrange a plurality of biprisms in an imaging optical system of a specimen. An upper electron biprism is arranged upstream of the specimen in the traveling direction of the electron beam, and an image of the electron biprism is formed on the specimen (object plane) using an imaging action of a pre-field of the objective lens. A double-biprism interference optical system is constructed of a lower electron biprism disposed downstream of the objective lens up to the first image plane of the specimen.

8 Claims, 15 Drawing Sheets

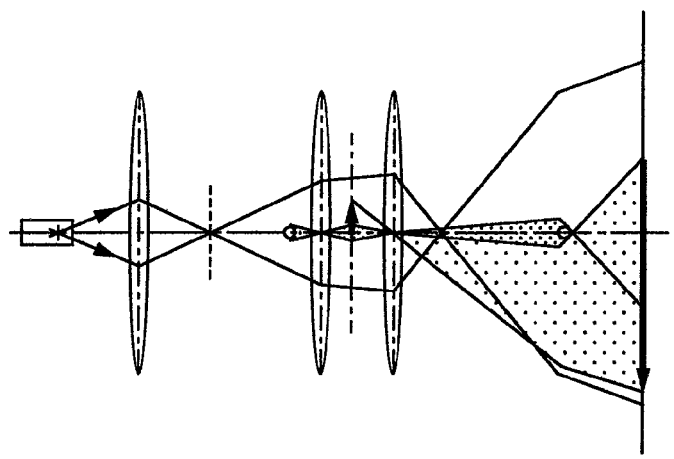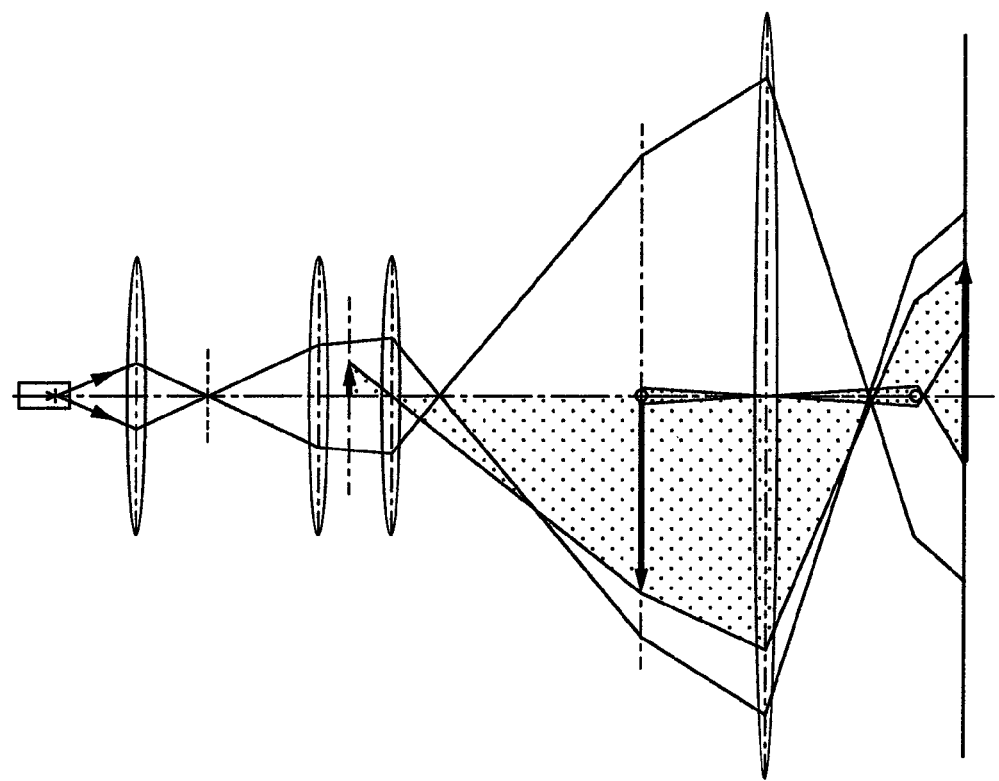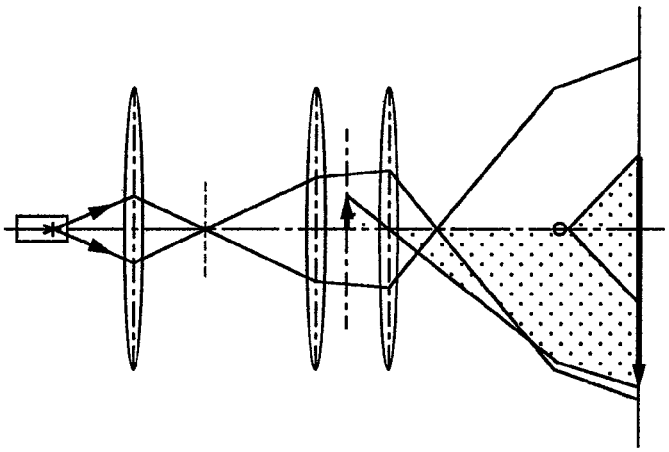

ELECTRON BEAM DEVICE

CLAIM OF PRIORITY

The present application claims priority from Japanese application JP 2008-033948 filed on Feb. 15, 2008, the content of which is hereby incorporated by reference into this application.

BACKGROUND OF THE INVENTION

The present invention relates to an electron beam device making up an interferometer using an electron biprism.

An electron biprism is used in explanations of the present specification. The electron biprism is a device in electron optics having the same action as that of Fresnel's biprism in optics and is classified into two types; electric field type and magnetic field type. Of the two, the one more widely used is the electric field type electron biprism and has such a shape as shown in FIG. 1. That is, the electric field type electron biprism is made up of a filament electrode 9 in the center and parallel flat plate type grounded electrodes 99 held so as to sandwich the electrode. For example, when a positive voltage is applied to the central filament electrode 9, as shown in FIG. 1, electron beams passing in the vicinity of the filament electrode sense the potential of the central filament electrode and are deflected in mutually opposed directions (see trajectories 24 of the electron beams). The greater the distance from the central filament electrode, the smaller the potential acting on the electron beams becomes, but since the acting spatial range is long, the deflection angle of the electron beam is proportional to an applied voltage to the filament electrode irrespective of the position of incidence as a consequence. That is, assuming α is the deflection angle of the electron beam by the electron biprism, there is a simple relationship expressed as $\alpha = kV_f$ using an applied voltage $V_f$ to the central filament electrode and a deflection factor k. The fact that the deflection angle α of the electron beam is not dependent on the position of incidence is an important feature as the optical device and a plane wave (wavefront 22) remains as is with only the propagation direction deflected, and passed away from the electron biprism. This corresponds to the effect of a biprism combining two prisms in optics, and is called an "electron biprism." The electron biprism using a potential for deflecting an electron beam is called an "electric field type electron biprism" and the electron biprism using Lorentz force between the magnetic field and electron beam is called a "magnetic field type electron biprism." The present specification will give explanations using the electric field type electron biprism. However, the present invention can be configured by any device, whether electric field type or magnetic field type, if the device at least allows interference with an electron beam as the electron biprism, and is not limited to the electric field type electron biprism used for explanations. Furthermore, when the present specification describes an "electron biprism," this means an entire electron biprism as an electron beam deflector including a central filament electrode in a broad sense and describes a "central filament electrode of an electron biprism" as a general rule when the specification refers to an exact position in an optical system.

The electron biprism is a device indispensable to creating electron beam interference in an electron beam with no beam splitter such as a half mirror in optics. As is also clear from FIG. 1, this is attributable to the function of separating a wavefront 22 of one electron beam into two wavefronts and deflecting the wavefronts in the mutually opposed directions. As a result, the two separated electron beams after passing through the electron biprism are superimposed behind the electron biprism and produce an interference fringe 8. Such an electron optical system is generically called an "electron beam interference optical system."

<Single-Biprism Electron Interferometer>

As shown in FIG. 2, a most common electron beam interferometer represented by electron holography disposes one electron biprism between an objective lens 55 and an image plane 71 of a specimen, applies a positive voltage to a central filament electrode 9, thereby causes an electron beam that has passed through the specimen (object wave 21: electron beam that passes on the left of the central filament electrode, shown with hatching in FIG. 2) and an electron beam that passes on the side where the specimen does not exist (reference wave 23: electron beam that passes on the right of the central filament electrode in FIG. 2) to be superimposed together and obtains an interferogram (31 and 8: image resulting from superimposition of the interference fringe 8 on the specimen image 31). In this case, there is a predetermined relationship between an interference fringe spacing s and an interference width W and these are expressed by the following expressions as an interference fringe spacing $s_{obj}$ and interference width $W_{obj}$ backprojected onto the specimen plane.

[Expression 1]

$$s_{obj} = \frac{1}{M} \frac{D\lambda}{2\alpha(D-L)} \quad (1)$$

[Expression 2]

$$W_{obj} = \frac{1}{M}\left(2\alpha L - \frac{D}{D-L}d_{fi}\right) \quad (2)$$

Here, α (rad) is a deflection angle of the electron beam by the electron biprism. Other reference characters mainly relate to distances between elements such as the object, lens and image in the optical system and are shown in FIG. 2. That is, "a" denotes a distance between a specimen plane 3 (object plane) and the objective lens 55, "b" denotes a distance between the objective lens 55 and the image plane 71 of the specimen, "D" denotes a distance from an image plane 11 of an electron source below the objective lens to the image plane 71 of the specimen by the objective lens 55 and "L" denotes a distance from the central filament electrode 9 of the electron biprism to the image plane 71 of the specimen. Furthermore, "M" denotes a magnification M=b/a of this optical system and "$d_{fi}$" denotes a diameter of the central filament electrode 9.

As is clear from Expressions (1) and (2), both the interference fringe spacing $s_{obj}$ and interference width $W_{obj}$ are functions of the deflection angle α of the electron beam and cannot be controlled independently of each other only by an applied voltage $V_f$ to the central filament electrode.

When a charged particle beam including an electron beam passes through the electromagnetic lens, a rotation of an azimuth centered on the optical axis occurs in the charged particle beam, but FIG. 2 omits this rotation and describes an equivalent plane including the optical axis as an electron optical system. Furthermore, suppose the central filament electrode 9 is disposed perpendicular to the plane of the sheet, the cross section of the electrode is shown with a small circle and parallel flat plate type grounded electrodes on both sides of the central filament electrode 9 are omitted. The omission of the rotation of this azimuth in the figure of the optical system and the omission of the display of the central filament electrode or the like will be the same in subsequent figures unless specified otherwise. Moreover, in the figure showing the optical system in the present specification, since the pre-field of an objective lens system 5 which will be described later is an important element unless specified otherwise, the optical system is separated into two portions of a pre-field lens 51 and the objective lens 55 or separated into three portions of the pre-field lens 51, a middle pre-field lens 53 (see FIGS. 12 to 14) and the objective lens 55.

<Double-Biprism Electron Interferometer>

It is a multi-biprism electron interferometer that has been developed so as to overcome the disadvantage of the single-biprism electron interferometer that the interference fringe spacing s and interference width W cannot be controlled independently of each other. FIG. 3 shows a double-biprism interference optical system which is the simplest configuration of the multi-biprism electron interferometer.

In this optical system, an upper electron biprism 91 is disposed on a first image plane 71 of a specimen downstream of an objective lens and a lower electron biprism 95 is disposed between an image plane 12 of a source imaged by a first intermediate lens 61 disposed downstream of the first image plane 71 in the traveling direction of the electron beam and a second image plane 72 of the specimen downstream of the first intermediate lens and also in the shadow of a central filament electrode 9 of the upper biprism (shown by dark hatching in FIG. 3). In FIG. 3, both central filament electrodes are disposed perpendicular to the plane of the sheet. The two parameters of the interferogram (31 and 8) in this configuration; interference fringe spacing s and interference width W are back-projected onto the specimen plane and are expressed as an interference fringe spacing $s_{obj}$ and interference width $W_{obj}$ by the following expressions.

[Expression 3]
$$s_{obj} = \frac{1}{M_U}\frac{1}{M_L}\frac{\lambda D_L}{2\left\{\frac{b_2}{a_2}D_U\alpha_U + (D_L - L_L)\alpha_L\right\}} \quad (3)$$

[Expression 4]
$$W_{obj} = \frac{1}{M_U}\left(\frac{1}{M_L}2L_L\alpha_L - d_U\right) \quad (4)$$

where, "$\alpha_U$" is a deflection angle of the electron beam by the upper electron biprism 91 and "$\alpha_L$" is a deflection angle of the lower electron biprism 95. Furthermore, other characters in the expression mainly relate to distances between the respective components in the optical system such as the object, lens and image and are shown in FIG. 3. That is, "$a_U$" is a distance between a specimen plane 3 (object plane) and the objective lens 55, "$b_U$" is a distance between an objective lens 55 and the first image plane 71 of the specimen, "$a_L$" is a distance between the first image plane 71 of the specimen (object plane of the first intermediate lens) and the first intermediate lens 61, "$b_L$" is a distance between the first intermediate lens 61 and the second image plane 72 of the specimen, "$a_2$" is a distance between an image plane 11 of the electron source below the objective lens and the first intermediate lens 61, "$b_2$" is a distance between the first intermediate lens 61 and an image plane 12 of the electron source below the first intermediate lens, "$D_U$" is a distance from the image plane 11 of the electron source below the objective lens to the image plane 71 of the specimen by the objective lens, "$D_L$" is a distance from the image plane 12 of the electron source below the first intermediate lens to the image plane 72 of the specimen (second image plane of the specimen) by the first intermediate lens and "$L_L$" is a distance from the central filament electrode 95 of the lower electron biprism to the second image plane 72 of the specimen. Furthermore, "$M_U$" and "$M_L$" are magnifications $M_U = b_U/a_U$ and $M_L = b_L/a_L$ of this imaging optical system respectively and "$d_U$" is a diameter of the central filament electrode of the upper electron biprism.

As is clear from Expressions (3) and (4), the interference fringe spacing $s_{obj}$ is expressed as a function of $\alpha_U$ and the interference width $W_{obj}$ is expressed as a function of $\alpha_L$ and $\alpha_L$, and though not completely independent of each other, these parameters can be controlled effectively independently of each other by determining a sequence of operations for acquiring an interferogram as:

(1) Defining a required interference width by adjusting the applied voltage to the lower electron biprism 95, and (2) Obtaining a required interference fringe spacing by adjusting the applied voltage to the upper electron biprism 91.

Now if the central filament electrode 95 of the lower electron biprism is disposed on the image plane 12 of the source by the first intermediate lens in FIG. 3, that is, when a parameter $D_L - L_L = 0$, s and W can be controlled completely independently of each other (see JP-A-2005-197165, JP-A-2007-115409 and JP-A-2006-216345).

<Triple-Biprism Electron Interferometer>

It is a triple-biprism electron optical system that the optical system of the double electron biprism has been further developed and one example thereof has such a configuration as shown in FIG. 4. An upper electron biprism 91 is disposed on a first image plane 71, a middle electron biprism 93 is disposed on a second image plane 72 and a lower electron biprism 95 is disposed between a second intermediate lens 62 and a third image plane 73. The azimuth of the central filament electrode 93 of the middle electron biprism is orthogonal to the upper electron biprism 91. In FIG. 3, the central filament electrode 91 of the upper electron biprism is expressed with a horizontally oriented line assumed to be disposed within the plane represented by the plane of the sheet and the central filament electrode 93 of the middle electron biprism is expressed with a cross section of the electrode (same as FIG. 2 and FIG. 3) assumed to be disposed perpendicular to the plane represented by the plane of the sheet. Furthermore, since the azimuth of the central filament electrode 95 of the lower electron biprism forms an angle of 45° with the upper and middle filament electrodes, the azimuth is expressed with a short horizontal line in FIG. 4. The position of the triple-electron biprism in the optical system and relative azimuths of the respective central filament electrodes are not limited to those in FIG. 4 and can take various positional relationships and azimuthal relationships. Though expressions are not described, this optical system can control not only the interference fringe spacing s and interference width W but also an azimuth θ of interference fringe independently of each other (see JP-A-2006-313069).

As shown above, the problems with control on parameters (interference fringe spacing s, interference width W and azimuth θ) of the interferogram are solved by the multi-biprism electron interferometer.

The multi-biprism electron interferometer adopts a configuration with a plurality of electron biprisms arranged in an imaging optical system and the effect of electron beam deflection by the biprisms in the optical system is achieved by combining lenses corresponding to the respective biprisms and operating the biprisms in association therewith. Therefore, as is clear from comparisons between FIG. 2 and FIG. 3 or FIG. 4, the specimen is finally imaged as an appropriate interferogram through the objective lens 55 right below the specimen and first intermediate lens 61 further therebelow in the double-biprism electron interferometer and through the objective lens 55, first intermediate lens 61 and lowest second intermediate lens 62 in FIG. 4 in the triple-biprism electron interferometer. The interferogram is further magnified/demagnified by electromagnetic lenses downstream in the traveling direction of the electron beam (not shown in FIGS. 2, 3 and 4) and finally observed and recorded as an interferogram. FIG. 5 shows an example of the optical system of a conventional transmission electron microscope when constructing a double-biprism electron interferometer. According to convention, in FIG. 5, the effects of the pre-field of the objective lens are described collectively in a condenser optical system 4 and shown in a single objective lens system 5.

As shown in FIG. 5, the conventional transmission electron microscope is constructed of a total of five imaging lens systems; the objective lens system 5 and four magnifying lens systems (made up of lenses 61 to 64). When a double-biprism electron interferometer is constructed, operating conditions of the objective lens system 5 and the first intermediate lens 61 are uniquely determined by adjusting the positions or the like of an imaging position 31 of a specimen 3 and an electron biprism 91. Furthermore, the second projection lens 64 at the final stage of the imaging lens is often used specialized for projecting of the final image to a recording system 79 such as a film. As a result, the second intermediate lens 62 and first projection lens 63 are the only electromagnetic lenses that can secure the degree of operational flexibility for an interferogram (35 and 8) such as a change of image magnification. That is, in order to construct a multi-biprism electron interferometer after securing the degree of operational flexibility for the interferogram (35 and 8), it is necessary to additionally configure not only the electron biprism but also the electromagnetic lens to the imaging optical system of the conventional electron microscope. For example, when an electromagnetic lens is added, the size of the entire device increases due to the addition of the electromagnetic lens. Furthermore, a control mechanism for operating the added electromagnetic lens also needs to be newly added, which complicates control.

BRIEF SUMMARY OF THE INVENTION

Typical examples of the present invention are shown below.

An electron beam device including an electron beam source, a condenser optical system for irradiating an electron beam emitted from the source onto a specimen, a specimen holder for holding the specimen irradiated with the electron beam and an imaging lens system for imaging the specimen, wherein a first electron biprism is disposed downstream of the condenser optical system in a traveling direction of the electron beam on an optical axis of the electron beam device and upstream of a position at which the specimen is disposed in the traveling direction of the electron beam and a second electron biprism is disposed downstream of the first electron biprism in the traveling direction of the electron beam via the specimen and one or a plurality of lenses of the imaging lens system.

(2) An electron beam device including an electron beam source, a condenser optical system for irradiating an electron beam emitted from the source onto a specimen, a specimen holder for holding the specimen irradiated with the electron beam and an imaging lens system for imaging the specimen, wherein the specimen is disposed downstream of the condenser optical system in a traveling direction of the electron beam on an optical axis of the electron beam device and upstream of the imaging lens system in the traveling direction of the electron beam, a first electron biprism is disposed in a magnetic field of a first electromagnetic lens belonging to the imaging lens system in the traveling direction of the electron beam and a second electron biprism is disposed downstream of the first electron biprism in the traveling direction of the electron beam.

When a double-biprism electron interferometer is taken as an example for explanation, the present invention disposes the upper electron biprism upstream of the specimen in the traveling direction of the electron beam and images the central filament electrode of the electron biprism on the specimen through a pre-field of the objective lens. That is, using the equivalence between the object plane and the image plane of the imaging optical system, the present invention constructs an optical system where the locations of the electron biprism and the specimen are switched round regarding the specimen plane (object plane of the objective lens) as a plane optically equivalent to the first image plane of the conventional double-biprism electron interferometer. On that basis, the present invention operates the electron biprism downstream of the objective lens as a lower electron biprism and constructs a double-biprism electron interference optical system without any additional configuration of electromagnetic lenses. This makes it possible to control two parameters of the interferogram; interference fringe spacing s and interference width W.

Imaging can be performed a plurality of times in a magnetic field depending on the intensity of the magnetic field of the objective lens (which will be described later) and it is possible to even construct a triple-biprism electron interference optical system using this effect of imaging a plurality of times without any additional configuration of electromagnetic lenses. Furthermore, using equivalence between the object plane of the imaging optical system and the image plane, there can be a plurality of arrangements in the relative positional relationship between the plurality of electron biprisms and the specimen, for example, in the triple-biprism electron interferometer such as (biprism, biprism, specimen: Embodiment 3), (biprism, specimen, biprism: Embodiment 4) and (specimen, biprism, biprism: Embodiment 5).

According to the present invention, one set or a plurality of sets of electron biprisms and electromagnetic lenses operated in association with the electron biprisms are arranged in the condenser optical system, and it is thereby possible to obtain a multi-biprism electron interferogram similar to that of the related arts in a configuration reduced by one set or a plurality of sets of electron biprisms downstream of the specimen in the traveling direction of the electron beam and electromagnetic lenses operated in association with the electron biprisms required in constructing a multi-biprism electron interferometer. Furthermore, using a pre-field of the objective lens as the electromagnetic lens operated in association with the electron biprism disposed upstream of the specimen, it is possible to obtain a multi-biprism electron interferogram similar to the conventional one without any additional configuration of new electromagnetic lenses in the condenser optical system. For example, in the case of a double-biprism electron interferometer, providing the pre-field of the objective lens with one-time imaging action makes it possible to obtain an interferogram by the double-biprism electron interferometer on the first image plane of the specimen without requiring any additional configuration of new imaging lenses. Therefore, it is possible to provide a conventional double-biprism electron interferometer through an electromagnetic lens system having completely the same number of electromagnetic lenses as those of a conventional electron microscope. The same applies to the case of a triple-biprism electron interferometer by providing the pre-field of the objective lens with imaging actions two times.

Furthermore, according to the present invention, it is possible to provide a device capable of obtaining an interferogram by using multi-biprisms with the same number of electromagnetic lens systems as a conventional single-biprism electron interferometer without decreasing the degree of operational flexibility of the multi-biprism electron interferometer so far.

Other objects, features and advantages of the invention will become apparent from the following description of the embodiments of the invention taken in conjunction with the accompanying drawings.

BRIEF DESCRIPTION OF THE SEVERAL VIEWS OF THE DRAWINGS

FIG. 10 shows a comparison between optical systems of electron interferometers using electron biprisms; (A) showing a single-biprism electron interferometer, (B) showing a double-biprism electron interferometer and (C) showing a double-biprism electron interferometer using a pre-field lens;

DETAILED DESCRIPTION OF THE INVENTION

First of all, an imaging action using a pre-field of an objective lens will be explained.

<Imaging Action of Pre-Field>

The fact that an electromagnetic field has a lens effect on an electron beam is a basic principle required for establishment of an electron microscope and since there are already many references, detailed descriptions will be omitted and an imaging optical system using a pre-field of an objective lens necessary to explain the present invention will be explained.

Assuming that the radial direction distance from an optical axis is r and the optical axis is z-axis when the position of a specimen is assumed to be the origin, a paraxial trajectory equation of an electron is expressed as follows.

[Expression 5]

$$\frac{d^2 r}{dz^2} + \frac{eB^2(z)}{8mV} r = 0 \tag{5}$$

where "e" and "m" denote the charge and mass of an electron and "V" denotes an accelerating voltage given to the electron.

Assuming the magnetic field created by an objective lens pole-piece is a bell-shape distribution, suppose "$B_0$" is maximum magnetic field intensity of the distribution and "$d_{Bell}$" is a full width at half maximum of the magnetic field distribution.

Figure 6A:
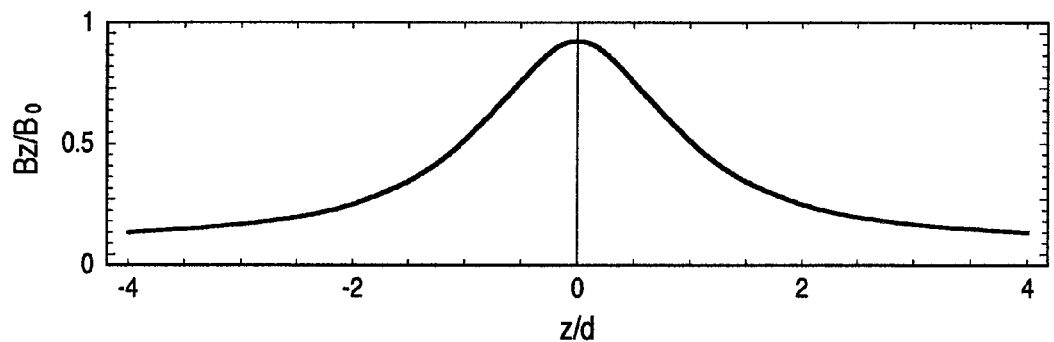
FIG. 6(A) shows a bell-shape magnetic field distribution, (B) shows trajectories of electrons when lens constant $k^2=0$, 1, 2, 3, (C) shows trajectories of electrons when lens constant $k^2=0$, 3, 8, 15.

[Expression 6]

$$B_z(z) = \frac{B_0}{1 + \left(\frac{z}{d_{Bell}}\right)^2} \tag{6}$$

where the magnetic field is assumed to become maximum intensity when z=0. FIG. 6A shows a state of this magnetic field distribution. In FIG. 6A, the horizontal axis matches the direction of the optical axis and the unit is displayed by being normalized by the full width at half maximum $d_{Bell}$ of the bell-shape distribution. From this, an expression of paraxial trajectory of the electron is obtained using the position of incidence $r_0$ upon a magnetic field.

[Expression 7]

$$\frac{r}{r_0} = \frac{\sin(\omega\varphi)}{\omega\sin(\varphi)} \tag{7}$$

where, a boundary condition of $\phi=0$ when $z=\infty$ is used. Furthermore, when a lens constant $k^2$ is defined as shown in Expression (8), there is a relationship shown in Expression (9) between $\omega$ in Expression (7) and the lens constant $k^2$.

[Expression 8]

$$k^2 = \frac{eB_0^2 d^2}{8mV} \tag{8}$$

[Expression 9]

$$\omega^2 = 1 + k^2 \tag{9}$$

The electron trajectory (Expression (7)) obtained above will be examined.

Figure 6B:
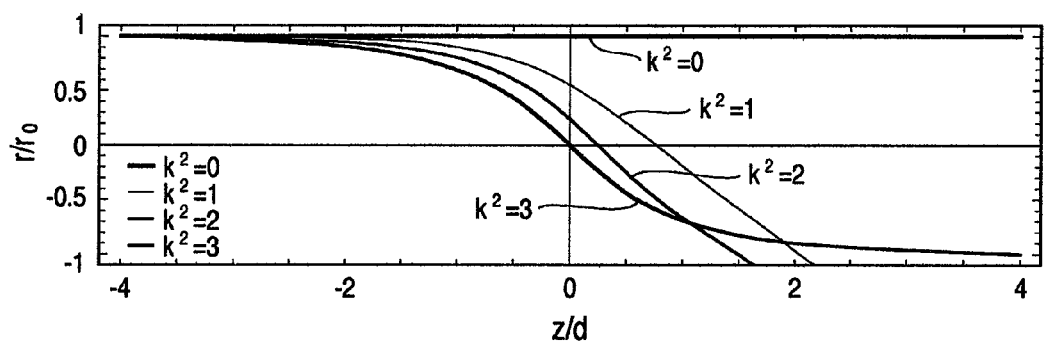
Figure 6C:
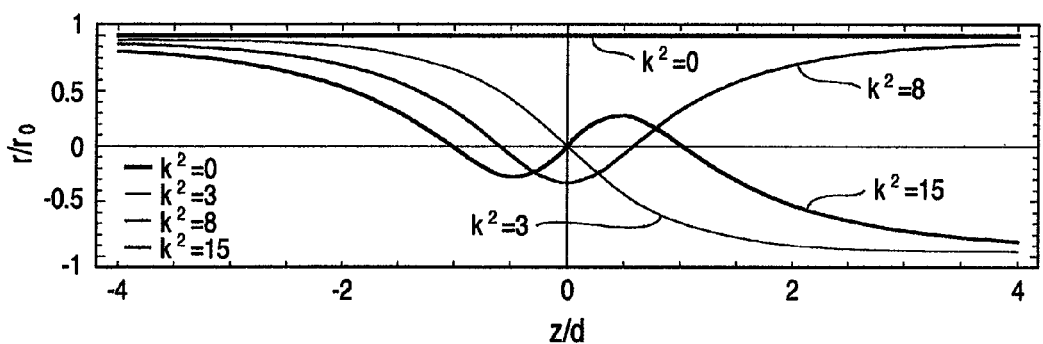

An electron beam travels straight forward when the magnetic field intensity is 0 ($k^2=0$), but the electron trajectory crosses the optical axis as $k^2$ increases, and the electron trajectory crosses the optical axis at a symmetric position (center position) of the magnetic field distribution when $k^2=3$ and then goes out of the magnetic field region parallel to the optical axis. Such a special condition under which the electron trajectory goes out of the magnetic field region parallel to the optical axis occurs when $\omega^2=1, 2, 3, \ldots$, that is, $k^2=0, 3, 8, 15 \ldots$. FIG. 6B shows the state of the trajectory when $k^2=0, 1, 2, 3$ and FIG. 6C shows the state of the trajectory when $k^2=0, 3, 8, 15$. FIG. 6A shows the bell-shape magnetic field distribution used for the calculation (described above). In FIG. 6C, the trajectory is observed to cross the optical axis once when $k^2=3$, twice when $k^2=8$ and three times when $k^2=15$ and then go out parallel to the optical axis. That is, when the magnetic field increases, it is understandable that imaging action is obtained twice when the lens constant $k^2$ is 8 and three times when the lens constant $k^2$ is 15. This is the effect based on a spiral motion in the magnetic field of charged particles and shows that if a strong magnetic field that satisfies these conditions is obtained, one electromagnetic lens can be physically made to act as a plurality of lenses.

Figure 7A:
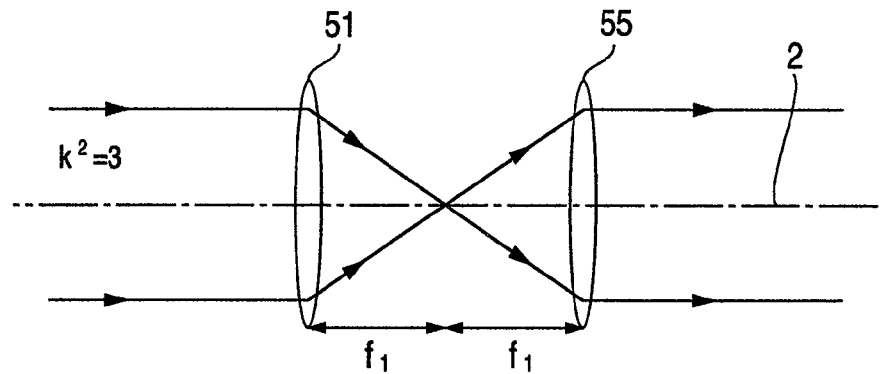
FIG. 7 is a schematic diagram of an optical system in which trajectories of electrons by a bell-shape magnetic field distribution are replaced by a confocal thin lens optical system; (A) showing a case of lens constant $k^2=3$, (B) showing a case of lens constant $k^2=8$ (three lenses) and (C) showing a case of lens constant $k^2=8$ (four lenses)
Figure 7B:
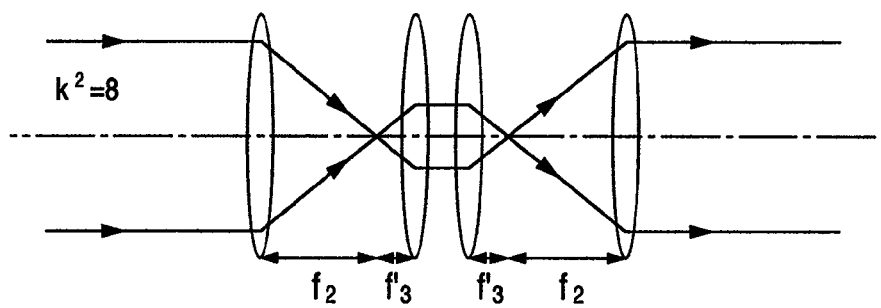
Figure 7C:
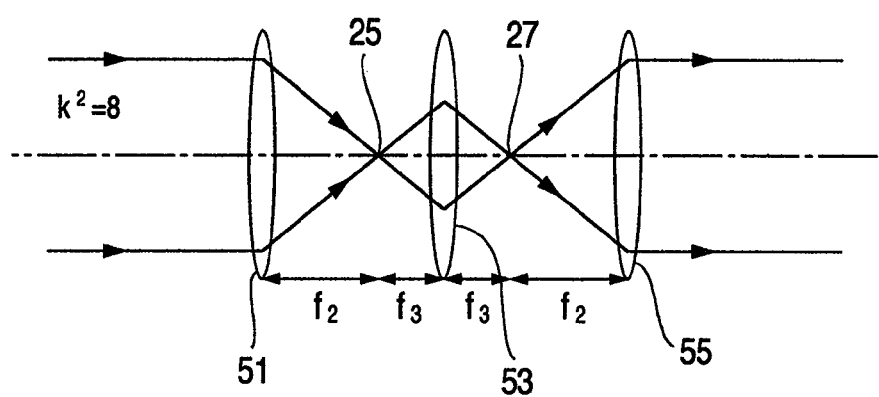

FIG. 7A is a schematic diagram showing the state of the trajectory corresponding to $k^2=3$ in FIG. 6C when the trajectory is replaced by two thin lenses (51, 55). It is understandable that this just corresponds to a confocal type optical system using two lenses. On the other hand, FIG. 7B is a schematic diagram showing the state of the trajectory corresponding to $k^2=8$ in FIG. 6C when the trajectory is replaced by four thin lenses and FIG. 7C is a schematic diagram showing the state of the trajectory corresponding to $k^2=8$ in FIG. 6C when the trajectory is replaced by three thin lenses (51, 53, 55). From the shape (FIG. 6C) of the electron trajectory, it seems more appropriate to describe FIG. 7B as the trajectory corresponding to $k^2=8$, but the schematic diagram in FIG. 7C may be more appropriate depending on the location of the specimen in the magnetic field in which imaging is performed a plurality of times. Hereinafter, the present invention will use a schematic diagram based on FIG. 7C with regard to the optical system when $k^2=8$ for the convenience of explanation about imaging a plurality of times within the magnetic field of the objective lens.

<Pre-Field Imaging Optical System>

Out of the need to reduce spherical aberration generated during imaging, a general transmission electron microscope uses a strong magnetic field in which the lens constant approximates to 3 in a range of $k^2<3$ and mounts a specimen so as to be disposed in the center of the magnetic field. That is, the specimen is immersed in the magnetic field and the lens action located upstream of the specimen in the electron beam (lens action on the left of FIG. 7A) is called a "pre-field lens" and is distinguished from the lens action downstream of the specimen. Since this pre-field lens is located upstream of the specimen in the electron beam, the pre-field lens is used as part of the condenser optical system to create a micro spot using a scanning transmission electron microscope or create a large angle convergent electron beam through convergent electron beam diffraction.

Figure 8:
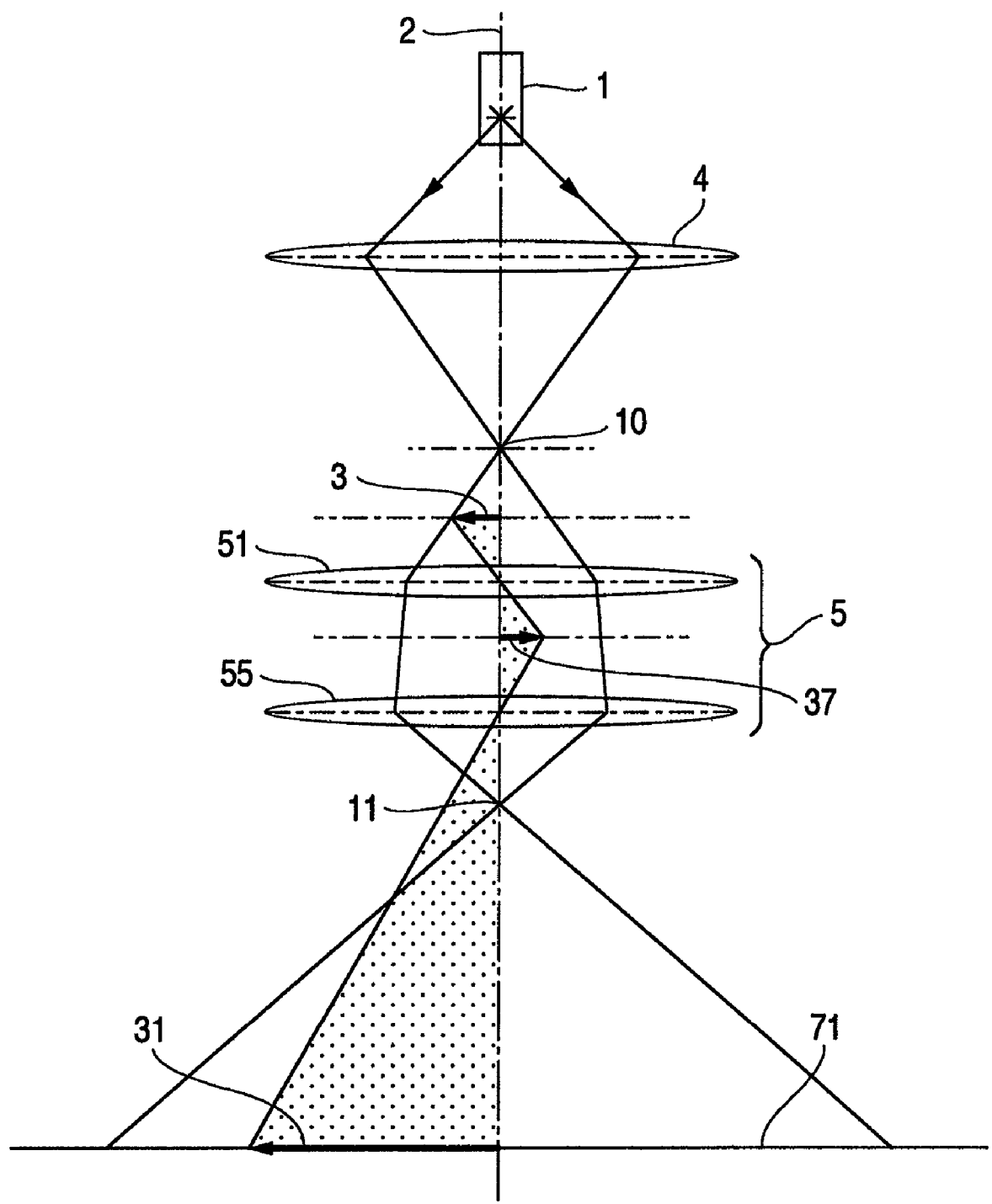
FIG. 8 is a schematic diagram showing an imaging optical system using a pre-field lens.

Suppose an optical system in which the specimen 3 is disposed further upstream of the pre-field lens 51 in the electron beam and an image is then formed at a conventional specimen position 37 and an image is formed by an objective lens 55 located further downstream is called a "pre-field imaging optical system." This is an optical system that causes one physical lens to act as if two lenses and causes each lens to contribute to imaging individually. FIG. 8 shows this optical system. This optical system has a feature that a pre-field lens 51 forms a demagnified image of the specimen 3 and then an objective lens 55 magnifies the image. For example, it is an object of the present invention to use one of two imaging actions for a multi-biprism electron interference optical system and eliminate the necessity for an additional configuration of the electromagnetic lens and realize a size reduction of the interferometer.

Hereinafter, embodiments will be explained in detail using the accompanying drawings.

Embodiment 1: Double-biprism Electron Interferometer Using Pre-field Lens (1)

The multi-biprism electron interferometer must arrange an image of the central filament electrode of the electron biprism and an image of the specimen within the same plane. In the optical system, since the image plane and the object plane are equivalent planes, for example, the optical system of a conventional double-biprism electron interferometer is configured so that the central filament electrode of the electron biprism is located on the image plane of the specimen. This Embodiment 1 adopts a configuration in which the image plane and the object plane are permutated with respect to each other and the specimen is located on the image plane of the central filament electrode of the upper electron biprism. Embodiment 1 has a feature that the aforementioned pre-field lens performs imaging of the central filament electrode. In other words, Embodiment 1 is characterized in that the image of the upper electron biprism is formed one or plurality of times in the magnetic field of the magnetic field lens located to be passed by the electron beam firstly after the electron beam passes the upper electron biprism and the image thereof is also formed on the object plane of each of the magnetic field lenses located to be passed by the electron beam after the electron beam passes the upper electron biprism and the magnetic field lens located to be passed by the electron beam firstly after the electron beam passes the upper electron biprism, that one of image planes of the upper electron biprism matches the specimen position, and that the image forming actions for the upper electron biprism and the specimen are obtained in subsequent downstream lens systems, or characterized by a configuration of an electron beam device that can realize such imaging actions.

It has been described above that the strong magnetic field distribution necessary to reduce influences of spherical aberration on the specimen image is a lens constant having a value approximate to 3 within a range of $k^2<3$. That is, it is understandable that it is sufficiently possible for the objective lens of the current transmission electron microscope to project and image the central filament electrode of the upper electron biprism onto the specimen using a magnetic field located upstream of the specimen in the electron beam (that is, pre-field lens).

Figure 9:
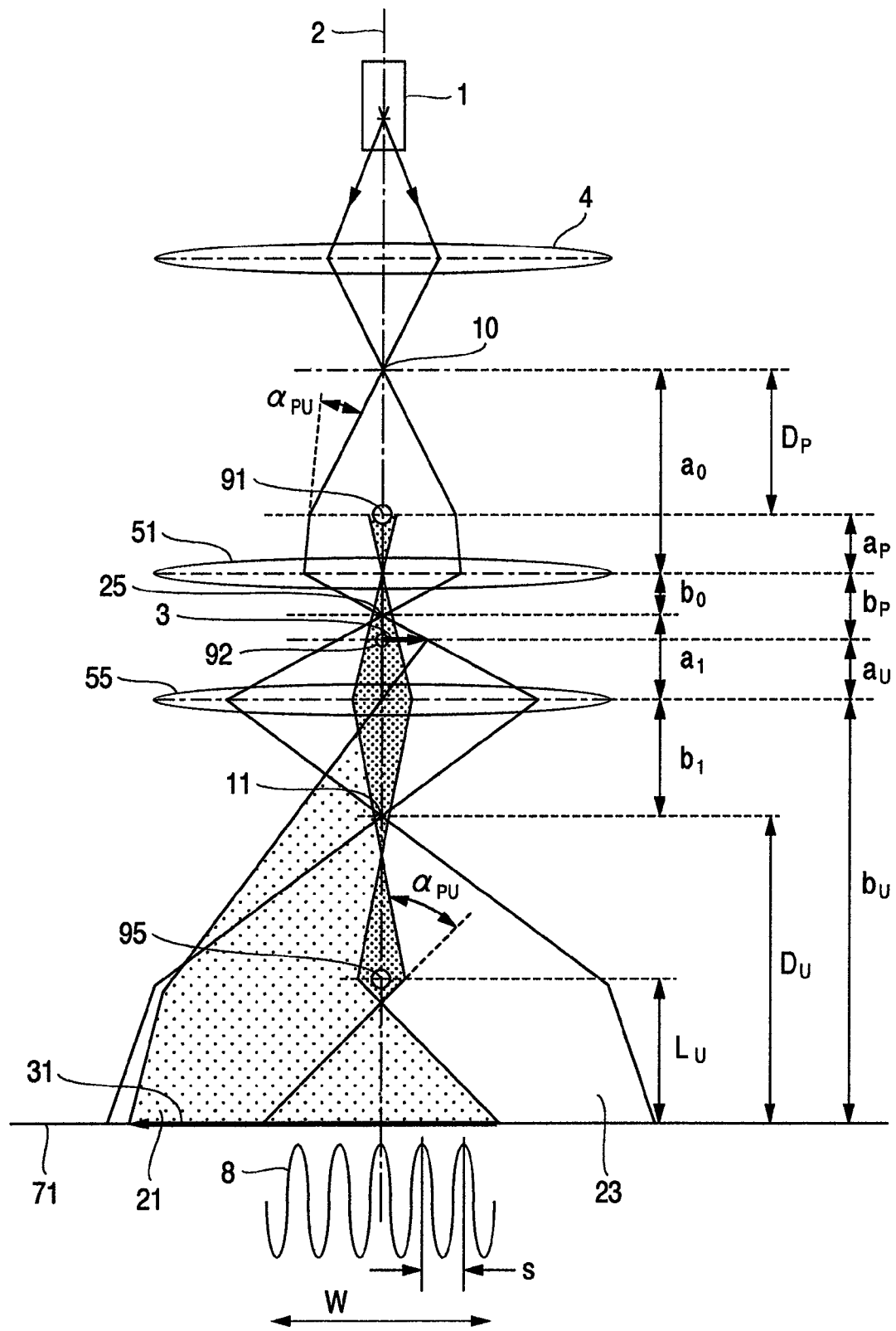
FIG. 9 is a schematic diagram showing an optical system of a double-biprism electron interferometer using a pre-field lens.

FIG. 9 shows an overview of an optical system of a double-biprism electron interferometer using a pre-field lens. An upper electron biprism 91 is disposed upstream of a specimen 3 and a lower electron biprism 95 is disposed between an objective lens 55 downstream of the specimen and a first image plane 71 of the specimen and also in the shadow of an upper central filament electrode. The position on the optical axis is not limited to FIG. 9 and it is only required that the position on the optical axis at which the specimen 3 is disposed match one image plane or a plurality of image planes on which an image of the upper biprism is formed. Furthermore, the upper electron biprism and the lower electron biprism are disposed within mutually parallel planes orthogonal to the optical axis of the electron optical system. Furthermore, the upper electron biprism and the lower electron biprism are enabled to move their positions or rotate the electrodes independently of each other and also apply a voltage to both electron biprisms independently of each other. If the geometric positional relationship in the electron optical system is as shown in FIG. 9, the relationship between parameters of the interferogram (31 and 8); interference fringe spacing s and interference width W, may be back-projected on the specimen plane as described above and can be expressed by the following expression as interference fringe spacing $s_{obj}$ and interference width $W_{obj}$.

[Expression 10]

$$s_{obj} = \frac{1}{M_U} \frac{\lambda D_U}{2\left\{\frac{b_1}{a_1}\frac{b_0}{a_0}D_P \alpha_{PU} + (D_U - L_U)\alpha_{PL}\right\}} \quad (10)$$

[Expression 11]

$$W_{obj} = \frac{1}{M_U} 2L_U \alpha_{PL} - M_P d_P \quad (11)$$

Figure 3:
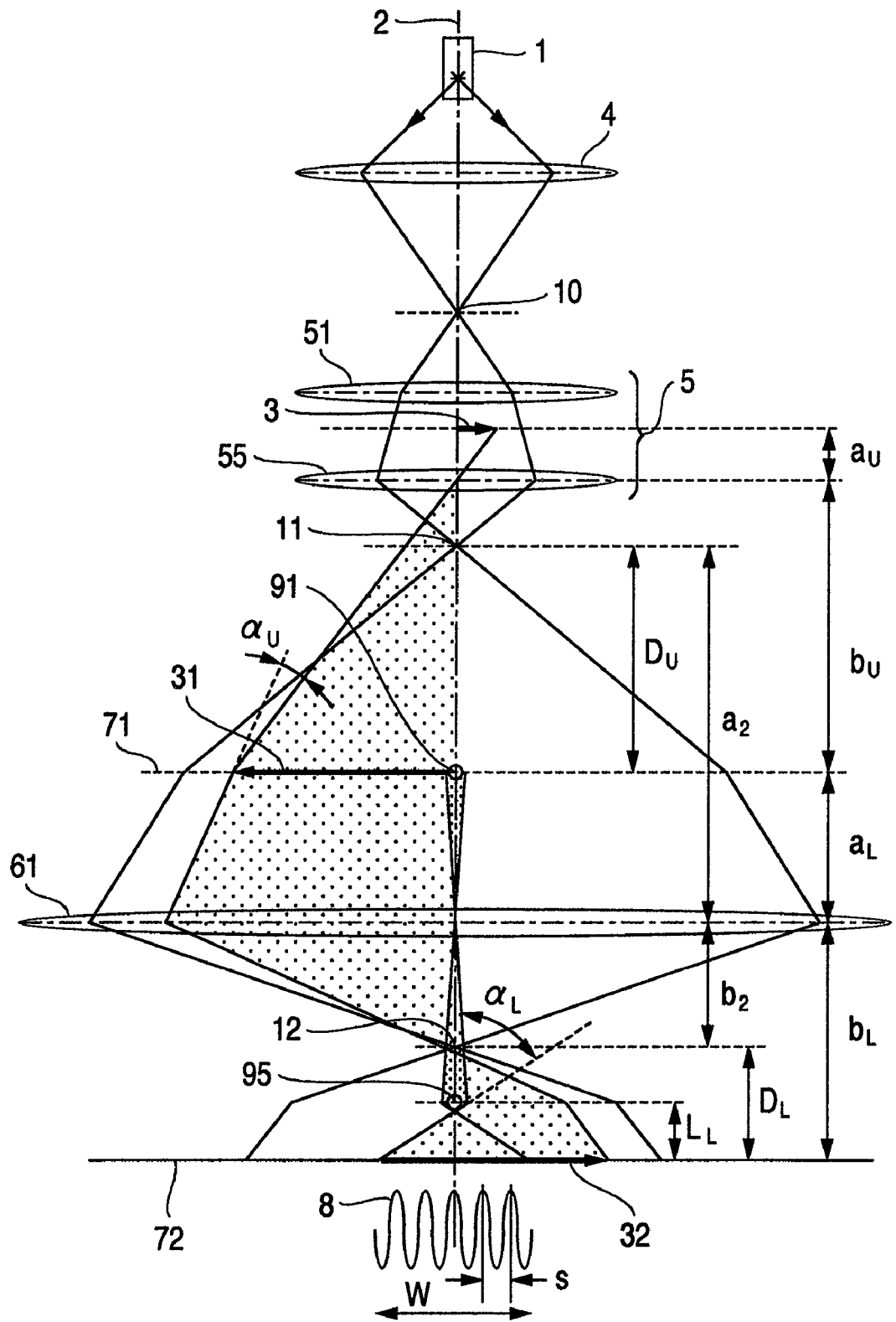
FIG. 3 is a schematic diagram showing an optical system of a double-biprism electron interferometer.

Here, $\alpha_{PU}$ is a deflection angle of the electron beam by the electron biprism 91 disposed upstream of a pre-field lens 51 and $\alpha_{PL}$ is a deflection angle of the electron biprism 95 disposed downstream of the objective lens. The electron biprism 91 disposed upstream of the pre-field lens 51 effectively corresponds to the upper electron biprism on the optical system and the electron biprism 95 disposed downstream of the objective lens effectively corresponds to the lower electron biprism on the optical system. However, the electron biprism 95 disposed downstream of the objective lens is disposed at a position corresponding to the upper electron biprism in a physical comparison of the device with the conventional double-biprism electron interference optical system (see FIG. 3). Furthermore, other reference characters in the expression mainly relate to distances between elements such as the object, lens and image in the optical system and are shown in FIG. 9. That is, "$a_P$" denotes a distance between the central filament electrode 91 of the electron biprism upstream of the pre-field lens and the pre-field lens 51, "$b_P$" denotes a distance between the pre-field lens 51 and the specimen plane 3 (image 92 of the central filament electrode of the electron biprism upstream of the pre-field lens), "$a_U$" denotes a distance between the specimen plane 3 (object plane) and the objective lens 55, "$b_U$" denotes a distance between the objective lens 55 and the image plane 71, "$a_0$" denotes a distance between an image 10 (cross over) of the electron source above the electron biprism upstream of the pre-field lens and the pre-field lens 51, "$b_0$" denotes a distance between the pre-field lens 51 and a source image by the pre-field lens, "$a_1$" denotes a distance between the image plane of the source image 25 by the pre-field lens and the objective lens 55, "$b_1$" denotes a distance between the objective lens 55 and an image 11 of the source by the objective lens, "$D_P$" denotes a distance between the central filament electrode 91 of the electron biprism upstream of the pre-field lens and the electron source image 10 above, "$D_U$" denotes a distance from the image plane 11 of the electron source below the objective lens to the image plane 71 (first image plane of the specimen) of the specimen by the objective lens and "$L_U$" denotes a distance from the electron biprism 95 disposed downstream of the objective lens to the first image plane 71 of the specimen. Furthermore, "$M_P$" and "$M_U$" are magnifications $M_P=b_P/a_P$ and $M_U=b_U/a_U$ of the imaging optical system respectively and "$d_P$" denotes a diameter of the central filament electrode 91 of the electron biprism upstream of the pre-field lens.

As in the case of the aforementioned double-biprism electron interferometer, since both an interference fringe spacing s and an interference width W depend on the deflection angle $\alpha_{PL}$ by the lower electron biprism, both parameters s and W cannot be controlled completely and independently, but as described above, adopting such an operation procedure as:

(1) Adjusting the applied voltage to the lower electron biprism 95 to set a required interference width, and
(2) Adjusting the applied voltage to the upper electron biprism 91 to obtain a required interference fringe spacing,
allows effectively independent control. When the lower electron biprism 95 is disposed on the image plane 11 (in the vicinity of the position of objective aperture) of the source by the objective lens in FIG. 3, that is, when parameter $D_L-L_L=0$, s and W can be controlled completely independently of each other. Such a relationship is completely the same as that of the conventional double-biprism electron interferometer.

For example, in the case of a transmission electron microscope having an accelerating voltage of 300 kV, the magnetic field intensity of the objective lens produced for an applied current 15 A to the objective lens is 2.4 T (tesla) and the focal length in this case is approximately 2 mm for both the pre-field lens 51 and the objective lens 55, and when the geometric distances between the respective elements in electron optics shown in FIG. 9 are configured as $a_P$=54 mm, $b_P$=2.7 mm, $a_U$=2.7 mm and $b_U$=168 mm, it has been experimentally confirmed that the magnification of the pre-field lens becomes $M_P$=1/20 (demagnified) and the magnification of the objective lens becomes $M_U$=54 (magnified).

Figure 1:
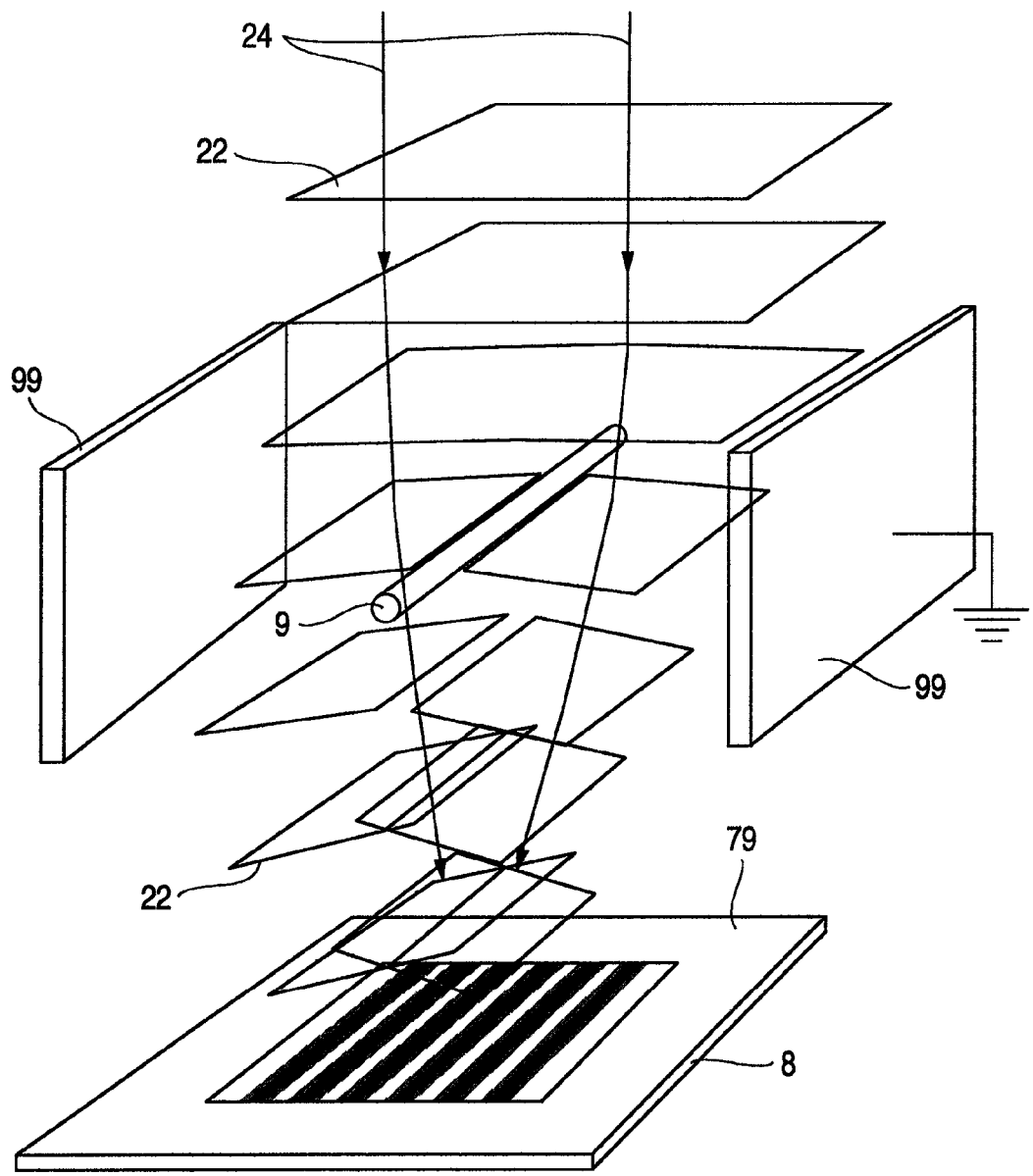
FIG. 1 is a schematic diagram showing a state of interference between an electric field type electron biprism and an electron beam.
Figure 2:
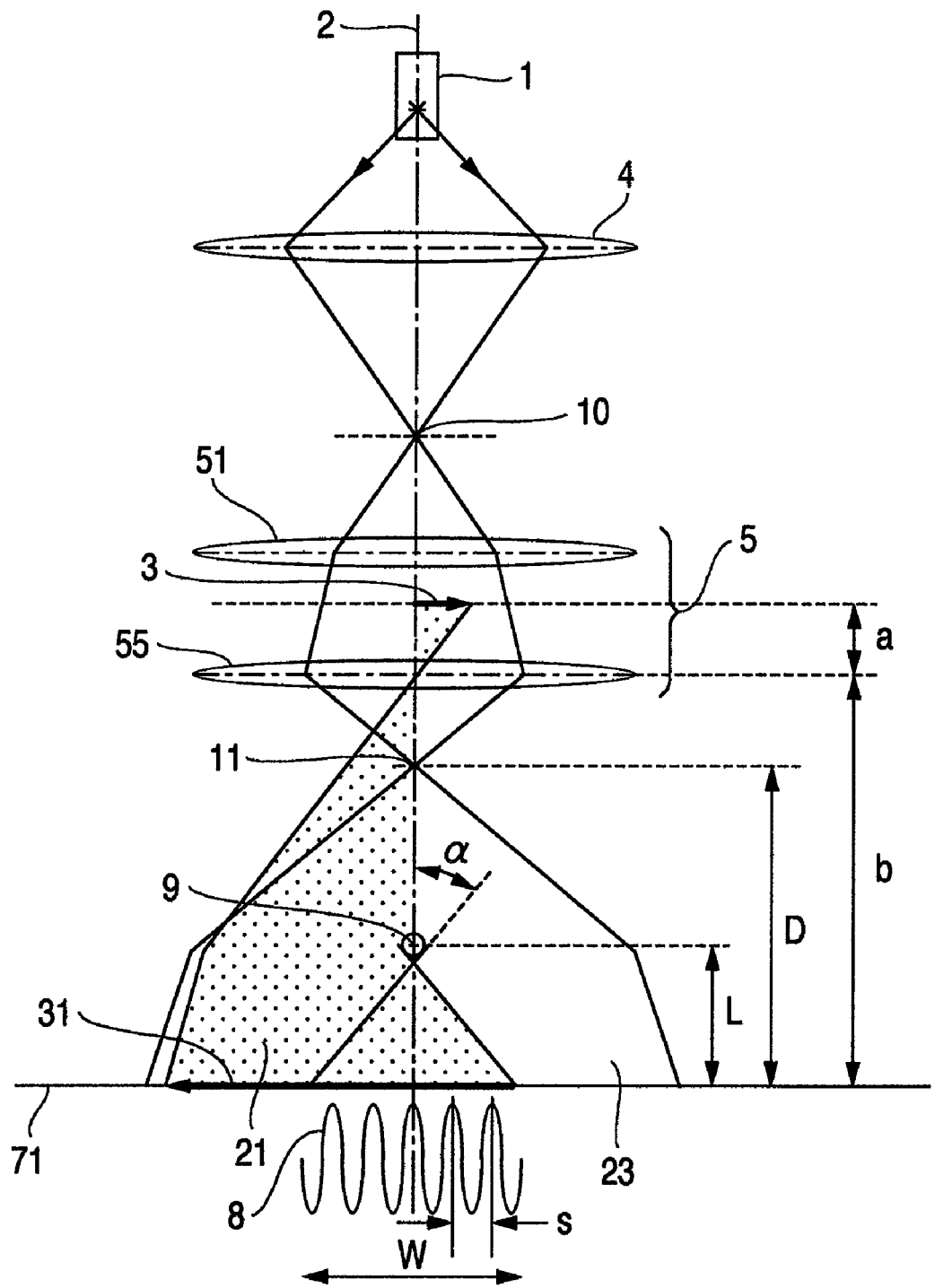
FIG. 2 is a schematic diagram showing an optical system of a single-biprism electron interferometer.
Figure 4:
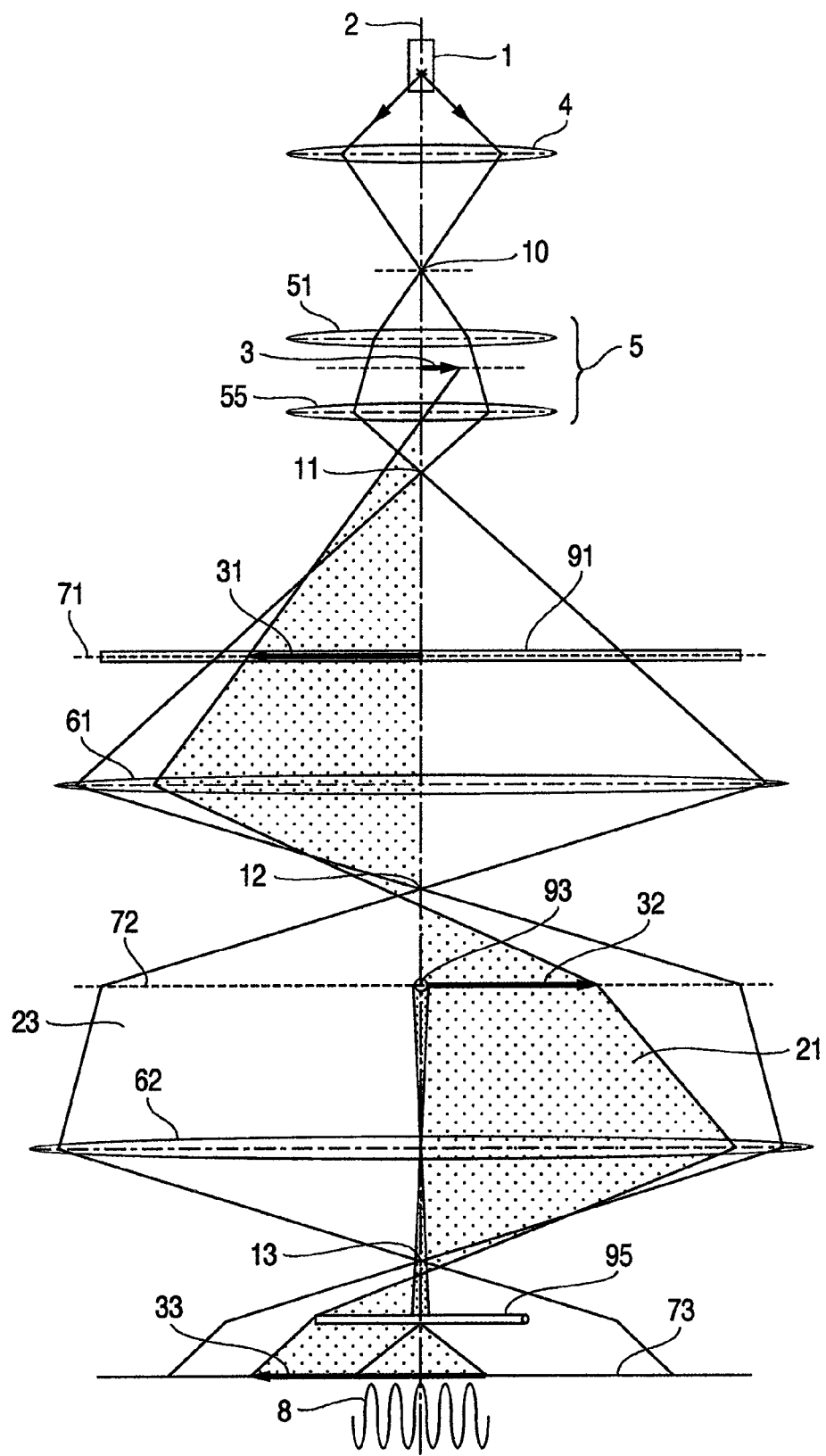
FIG. 4 is a schematic diagram showing an optical system of a triple-biprism electron interferometer.
Figure 5:
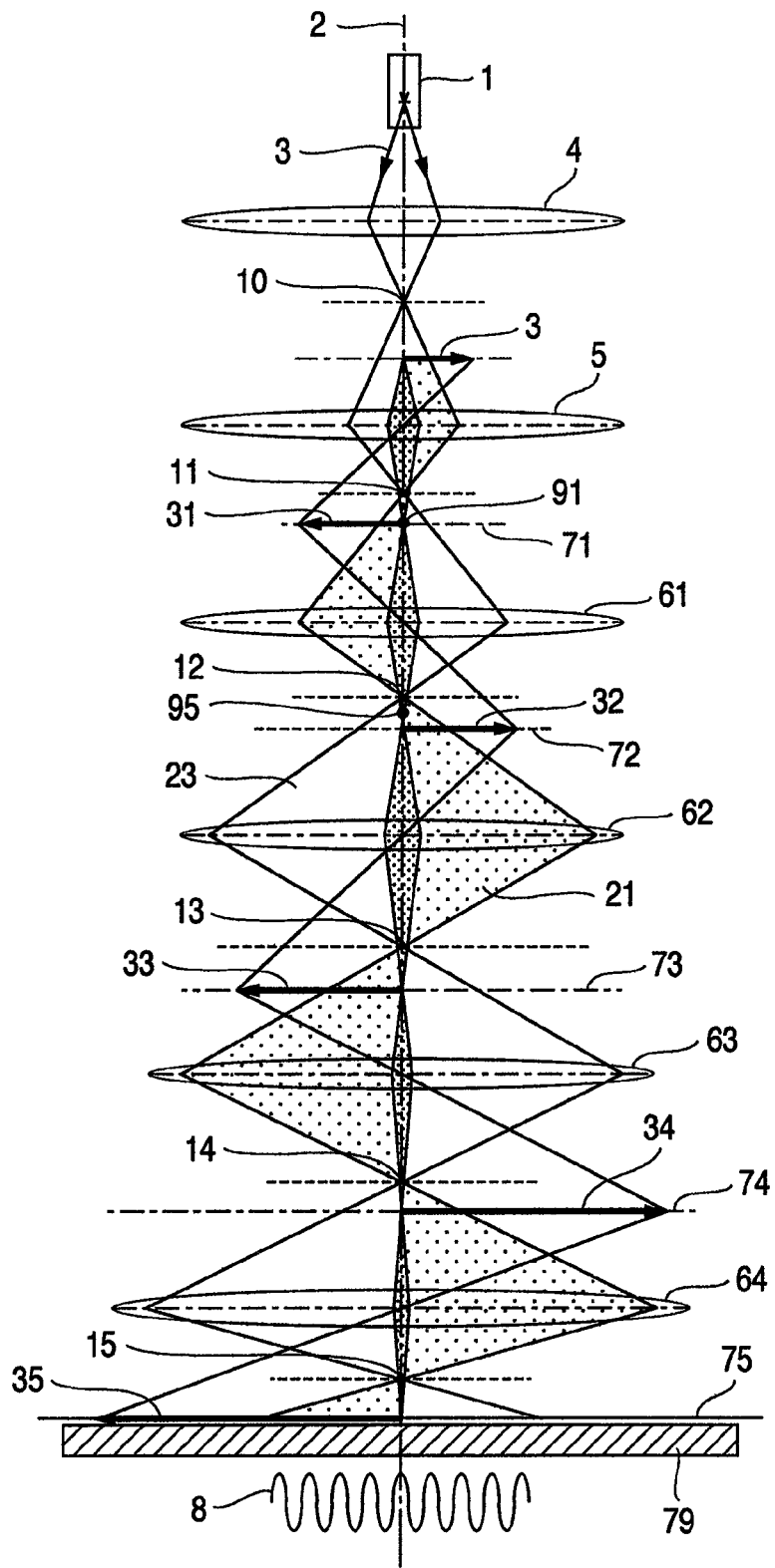
FIG. 5 is a schematic diagram showing an optical system when a double-biprism electron interferometer is constructed in a conventional electron microscope.

In order to use the imaging action of the pre-field lens, the configuration of this optical system allows the overall size of the optical system device to be reduced. FIG. 10A shows a single-biprism electron interferometer (similar to that in FIG. 2) currently most widely used, FIG. 10B shows a conventional double-biprism electron interferometer (similar to that in FIG. 4) and FIG. 10C shows the optical system (similar to that in FIG. 9) of a double-biprism electron interferometer using the pre-field lens according to the present invention arranged so that the positional relationships of the device become the same. As is clear from the figures, the optical system according to the present invention can configure the same interference optical system as that of a double-biprism electron interferometer in the same size and with the same number of physical lenses as those of a single-biprism electron interferometer. That is, the present invention eliminates the necessity for an additional configuration of electromagnetic lenses to be combined with the electron biprisms, which is a disadvantage of the double-biprism electron interferometer.

Furthermore, the optical system (FIG. 9) of this Embodiment 1 has completely the same configuration downstream of the specimen position in the traveling direction of the electron beam as that of a conventional high resolution, high magnification optical system. Therefore, this configuration causes no modification or without trouble to a high resolution observation of a crystal lattice image and can display the high resolution image observation performance of a conventional transmission electron microscope as is.

Embodiment 2: Double-biprism electron Interferometer Using Pre-field Lens (2)

Figure 11:
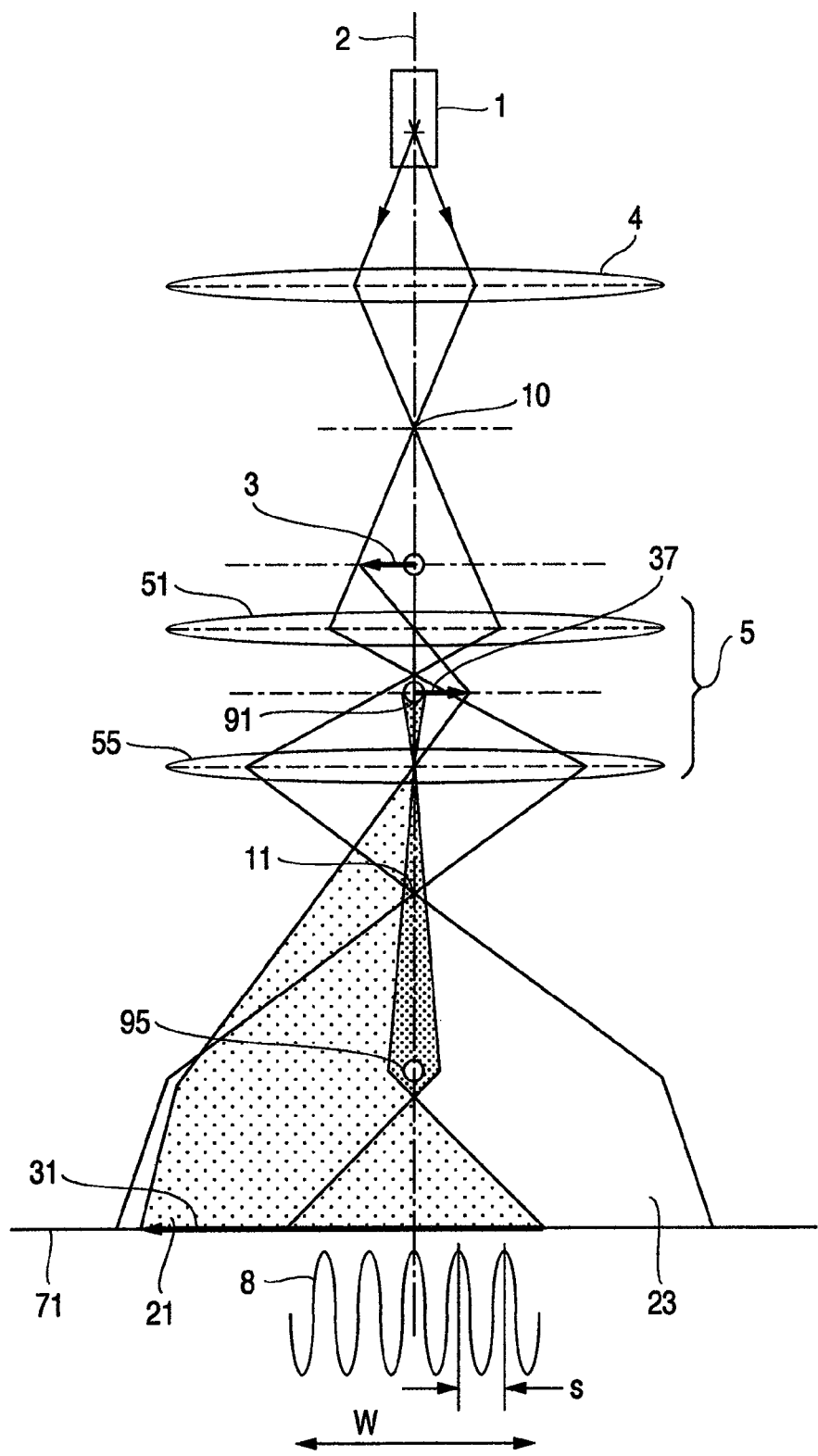
FIG. 11 is a schematic diagram showing an optical system of a modification example of a double-biprism electron interferometer using a pre-field lens.

FIG. 11 shows a modification example of a double-biprism electron interferometer using the pre-field lens explained in Embodiment 1. This has a configuration in which the positions of the upper electron biprism 91 and the specimen 3 of the interference optical system shown in FIG. 9 are switched round. The configuration of the optical system is completely the same as that of the conventional double-biprism electron interferometer shown in FIG. 2, but since the pre-field lens 51 is used for imaging of the specimen 3, a double-biprism electron interference optical system is constructed in the same size and with the same number of electromagnetic lenses as those of a single-biprism electron interferometer. This eliminates the necessity for an additional configuration of electromagnetic lenses to be combined with electron biprisms as in the case of Embodiment 1. Since parameters of the interferogram (31 and 8); interference fringe spacing $s_{obj}$ and interference width $W_{obj}$, are expressed in the same way as the conventional double-biprism electron interferometer, descriptions of expressions will be omitted here.

As for relationships between various parameters related to the electron optical system configuration, in the case of a transmission electron microscope having an accelerating voltage of 300 kV just like Embodiment 1, the magnetic field intensity of the objective lens generated for an applied current 15 A to the objective lens is 2.4 T (tesla) and the focal length in this case can be set to approximately 2 mm for both the pre-field lens 51 and the objective lens 55. Furthermore, when the geometric distances between the respective elements in the electron optics shown in FIG. 9 are configured as $a_P$=54 mm, $b_P$=2.7 mm, $a_U$=2.7 mm and $b_U$=168 mm, it has been confirmed that the magnification of the pre-field lens becomes $M_P$=1/20 (demagnified) and the magnification of the objective lens becomes $M_U$=54 (magnified). This Embodiment 2 differs from Embodiment 1 in that the specimen 3 is imaged in a reduced size by the pre-field lens 51 (image 37 by the pre-field lens) and then the image is magnified by the objective lens 55 to an image plane 71 of the objective lens (image 31 by objective lens). That is, under completely the same conditions of the lens and optical system, magnification of projection to the image plane 71 of the objective lens ($M_P \times M_U$) is on the order of three times. This means that only the magnification of the specimen becomes relatively $M_P$(=1/20) times (demagnified) under the condition of the conventional high resolution, high magnification interference optical system and shows that it is possible to realize an interference optical system of intermediate magnification having a magnification of a maximum of the order of 100 thousand times. In recent years, this gives appropriate means for interferogram observations in sub-micron size such as an electrical field distribution of pn-junctions in semiconductor elements scaled down to a nanosize and a magnetization distribution of spintronics-related magnetic elements. Since the specimen 3 is imaged in a reduced size by the pre-field lens 51, influences of lens aberration on the image 71 may increase, but since the magnification used is smaller than that of a high resolution observation, the influences of lens aberration are smaller. Furthermore, when influences of lens aberration should be suppressed, since this is an optical system that can be used together with a spherical aberration corrector which has been recently developed, the spherical aberration corrector can be newly added.

Furthermore, the specimen position of the optical system of this Embodiment 2 can be configured outside the path of magnetic flux of the objective lens, which makes it possible to provide observation conditions in a field free condition for the specimen. For this reason, through an observation of the magnetized state of a magnetic material or by adding a magnetic field application device, it is possible to observe a response to an outside magnetic field in a magnetized state in the magnetic material. Furthermore, this specimen position makes it easier to secure a large space around the specimen and thereby allows various functions to be added for an observation of the specimen. The addition of the above described magnetic field application mechanism is one example thereof. In addition, it is possible to add an analysis mechanism such as an X-ray analyzer, secondary electron analyzer, observation mechanism that changes the specimen temperature by heating or cooling, observation mechanism that causes a physical force to apply to the specimen such as compression or stretching, and thereby observe, through an interference microscope, state variations of the specimen material using these mechanisms.

This embodiment is the same as Embodiment 1 in that the position on the optical axis at which the specimen 3 is disposed needs only to match one or a plurality of image planes on which the image of the upper biprism is formed, that the upper electron biprism and the lower electron biprism are arranged within mutually parallel planes orthogonal to the optical axis of the electron optical system, that the upper electron biprism and lower electron biprism can move their positions and rotate their electrodes independently of each other and that a voltage can be applied to both electron biprisms independently of each other. The same applies to embodiments from Embodiment 3 onward, and therefore explanations thereof will be omitted.

Embodiment 3: Triple-biprism Electron Interferometer Using Pre-field Lens (1)

Figure 12:
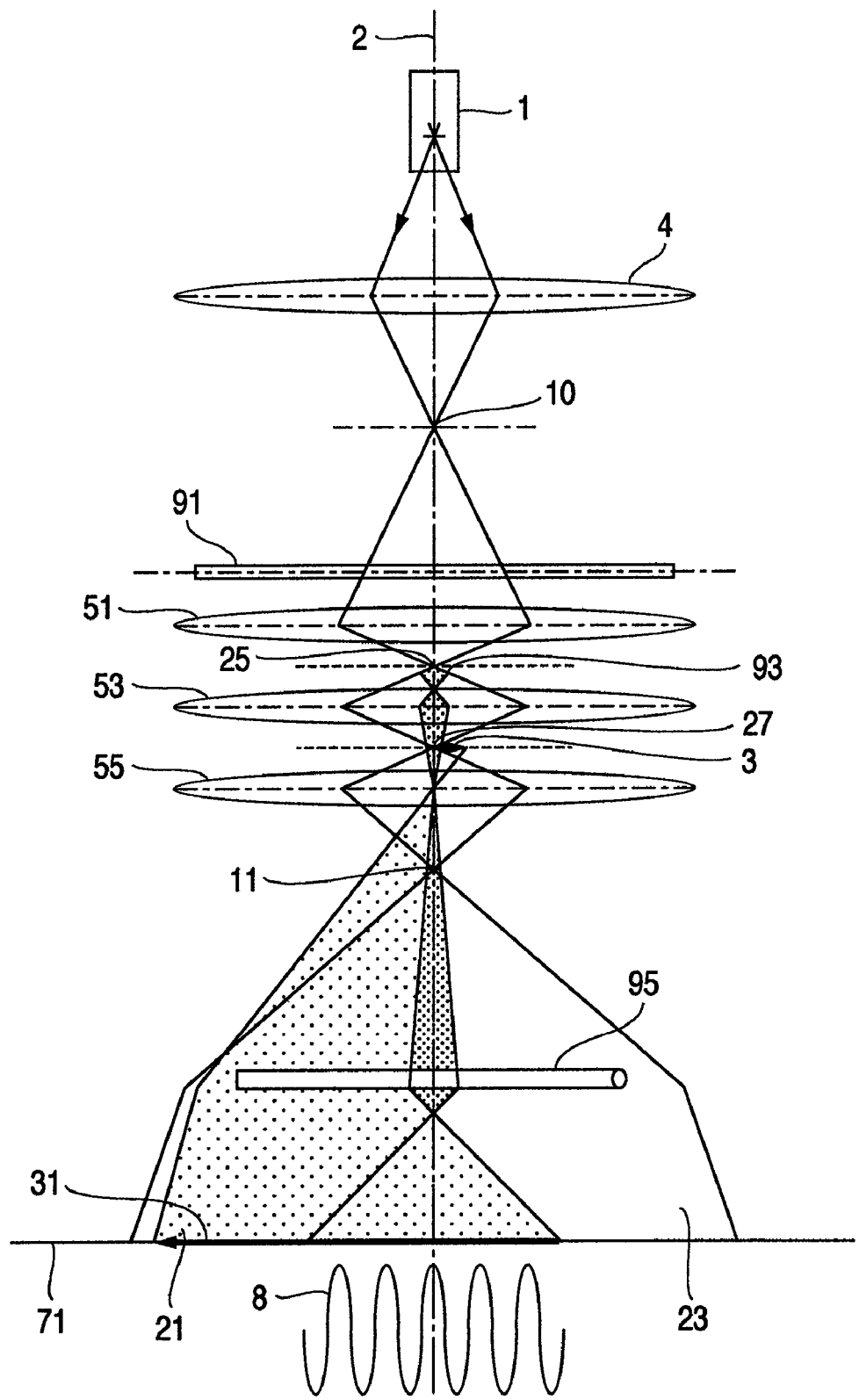
FIG. 12 is a schematic diagram showing an optical system of a triple-biprism electron interferometer using a pre-field lens.

FIG. 12 shows the optical system of a triple-biprism electron interferometer using a pre-field lens. This optical system uses a further stronger magnetic field than the conventional one explained in FIG. 7(C) and is an interference optical system using imaging actions two times in the magnetic field. Two electron biprisms are disposed; upper and middle electron biprisms upstream of the specimen 3 of the electron beam. A central filament electrode 93 of the middle electron biprism is located on the image plane of a central filament electrode 91 of the upper electron biprism and the specimen 3 is located on the image planes of the central filament electrodes of both electron biprism located upstream thereof. This example shows a case where the relative azimuths of the two electron biprism central filament electrodes upstream of the specimen 3 are orthogonal to each other. That is, the upper electron biprism central filament electrode 91 is disposed within the plane represented by the plane of the sheet and the middle electron biprism central filament electrode 93 is disposed perpendicular to the plane of the sheet. A lower electron biprism 95 is disposed between an objective lens 55 and an image plane 71 of the specimen by the objective lens and the azimuth of the central filament electrode 95 of the lower electron biprism forms an angle of, for example, 45° with respect to the central filament electrodes of both upstream electron biprisms. The angular relationship between these central filament electrodes is similar to that shown in FIG. 4. This Embodiment 3 disposes the two electron biprisms upstream of the specimen, obtains imaging actions corresponding to two electromagnetic lenses combined with both electron biprisms and operated in association therewith using the strong magnetic field distribution of the objective lens system 5, and thereby eliminates the necessity for an additional configuration of two electromagnetic lenses and therefore the size of the electron optical system device can be smaller than the conventional triple-biprism electron interference optical system by the two electromagnetic lenses. That is, as is clear from a comparison between FIG. 12 and FIG. 10, the triple-biprism electron interference optical system is constructed in the same size of the optical system as the conventional single-biprism electron interferometer. The relative magnifications between the central filament electrodes of the upper and middle electron biprisms and the specimen are determined by the positions of the respective optical systems. In the configuration of this Embodiment 3 just like the conventional triple-biprism electron interferometer, parameters of the interferogram (31 and 8); interference fringe spacing s, interference width W and azimuth θ of interference fringe, can be controlled independently of each other.

In the optical system of this Embodiment 3 (FIG. 12) like Embodiment 1, the configuration downstream of the specimen position in the traveling direction of the electron beam is completely the same as that of a conventional high resolution, high magnification optical system. For this reason, this configuration adds no change or interference to a high resolution observation of a crystal lattice image, rather applies stronger excitation conditions ($k^2=8$) to the objective lens than a conventional transmission electron microscope, and it is thereby possible to reduce spherical aberration of the objective lens compared to the conventional one. That is, it is possible to provide performance equal to or higher than the conventional high resolution image observation performance.

Embodiment 4: Triple-biprism Electron
Interferometer Using Pre-field Lens (2)

Figure 13:
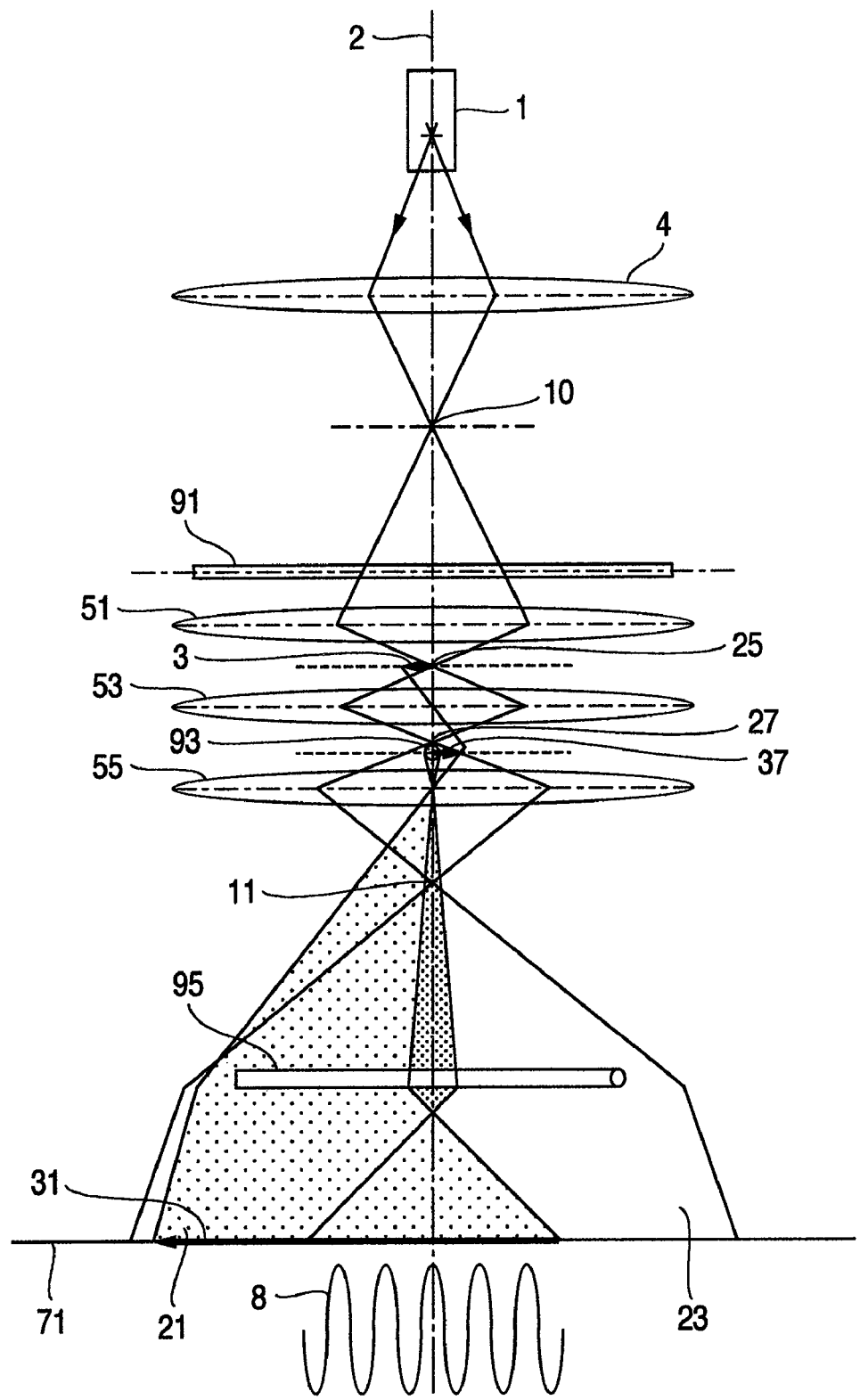
FIG. 13 is a schematic diagram showing an optical system of a first modification example of a triple-biprism electron interferometer using a pre-field lens.

FIG. 13 shows a first modification example of a triple-biprism electron interference optical system using pre-field lenses (51 and 53). This optical system uses the equivalence between an object plane and an image plane of the imaging optical system and changes the positional relationship between the middle electron biprism 93 and the specimen 3 in FIG. 12 and is based on a concept similar to the change of the positional relationship between the electron biprism in the double-biprism electron interferometer and the specimen (Embodiment 1 and Embodiment 2). The relative magnification between the central filament electrodes of the upper and middle electron biprisms and the specimen is different from Embodiment 3 due to the change of the positions of the middle electron biprism 93 and the specimen 3, but is the same in that the relative magnification is determined by their respective positions in the optical system. Furthermore, this embodiment is also similar to Embodiment 3 in that the size of the electron optical system device can be made smaller than the conventional triple-biprism electron optical system and the triple-biprism electron interference optical system is constructed in the same size of the optical system as that of the conventional single-biprism electron interferometer. In the configuration of this Embodiment 4 just like the conventional triple-biprism electron interferometer, parameters of an interferogram (31 and 8); interference fringe spacing s, interference width W and azimuth θ of the interference fringe can be controlled independently of each other.

Furthermore, in the optical system of this Embodiment 4 (FIG. 13), the specimen 3 is also immersed in the magnetic field and can also be used as a conventional high resolution, high magnification optical system as in the case of Embodiment 3. Since the objective lens is set to a stronger magnetic field condition ($k^2=8$) than the conventional transmission electron microscope, this embodiment is also similar to Embodiment 3 in that spherical aberration of the objective lens is small and it is possible to provide a device having performance appropriate for high resolution image observation.

Embodiment 5: Triple-biprism Electron
Interferometer Using Pre-field Lens (3)

Figure 14:
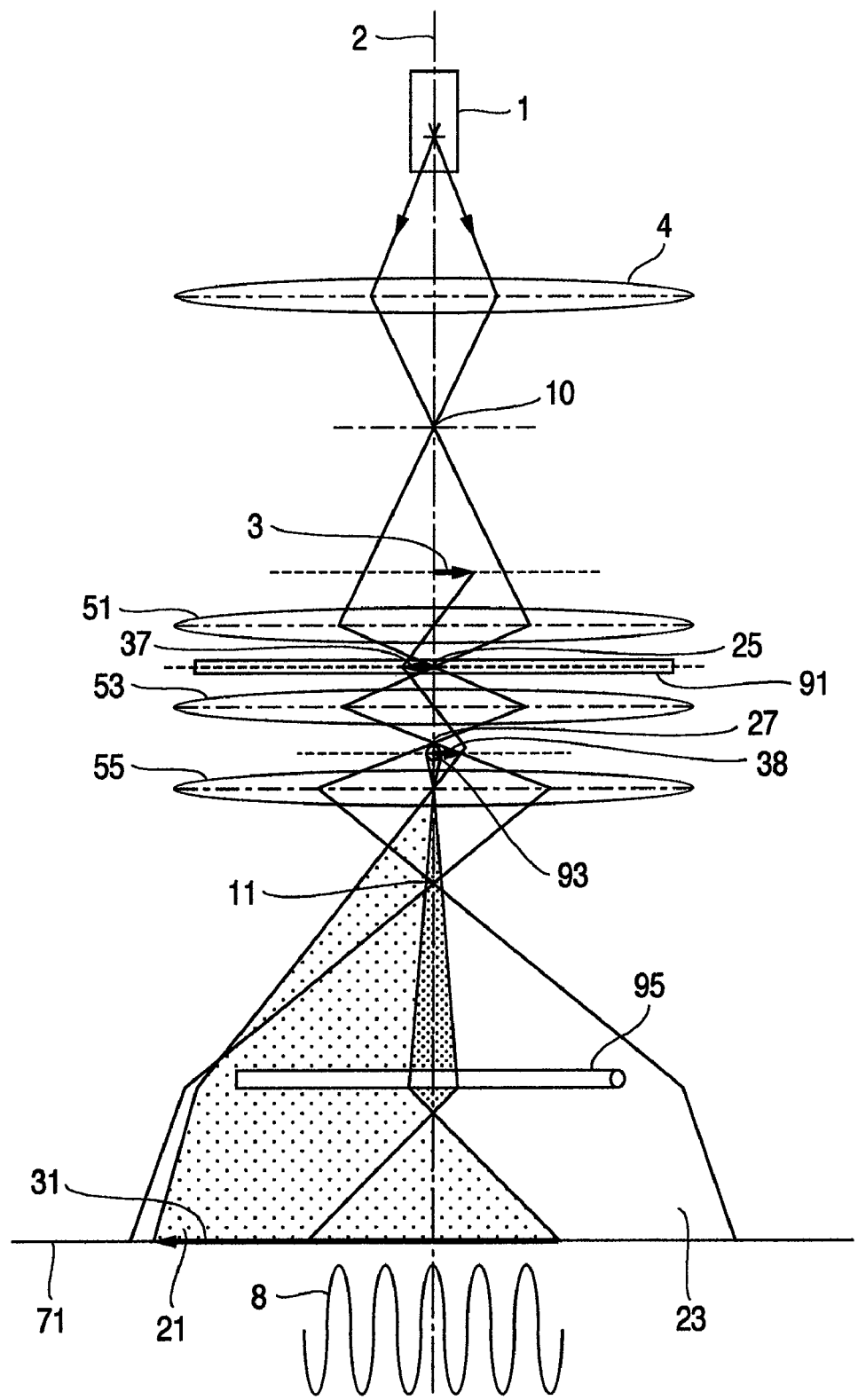
FIG. 14 is a schematic diagram showing an optical system of a second modification example of a triple-biprism electron interferometer using a pre-field lens.

FIG. 14 shows a second modification example of the triple-biprism electron interference optical system using pre-field lenses (51 and 53). As in the case of Embodiment 4 (first modification example), this embodiment also uses the equivalence between the object plane and the image plane of an imaging optical system and changes the positional relationship between the upper and middle electron biprisms (91 and 93) and specimen 3 in FIG. 11. Though the relative magnification between the central filament electrodes (91 and 93) of the upper and middle electron biprisms and the specimen 3 is different from that of Embodiment 3 and Embodiment 4, but this embodiment is the same in that the relative magnification is determined by the positions in the respective optical systems. Furthermore, this embodiment is also similar to Embodiment 3 and Embodiment 4 in that the size of the electron optical system device can be made smaller than the size of the conventional triple-biprism electron optical system and the triple-biprism electron interference optical system is constructed in the same optical system size as the conventional single-biprism electron interferometer. In the configuration of this Embodiment 5 just like the conventional triple-biprism electron interferometer, parameters of an interferogram (31 and 8); interference fringe spacing s, interference width W and azimuth θ of the interference fringe, can be controlled independently of each other.

This Embodiment 5 is different from Embodiment 3 and Embodiment 4 in that the specimen 3 is imaged in a reduced size by the pre-field lens 51 (image 37 by the pre-field lens) and then the image is magnified by the middle pre-field lens and objective lens 55 to an image plane 71 of the objective lens. Though the specimen position on the optical axis and lenses also vary depending on conditions, the projection magnification is smaller than that of Embodiment 3 and Embodiment 4. That is, this indicates that under conditions of a high resolution, high magnification interference optical system, it is possible to realize an interference optical system of intermediate magnification with only magnification of the specimen relatively reduced. In recent years, this gives appropriate means for interferogram observations in sub-micron size such as an electrical field distribution of pn-junctions in semiconductor elements scaled down to a nanosize and a magnetization distribution of spintronics-related magnetic elements. This is an effect similar to that of Embodiment 2. Since the specimen 3 is imaged in a reduced size by the pre-field lens 51, influences of lens aberration on the image 71 may increase, but since the magnification used is smaller than that of a high resolution observation, the influences of lens aberration are smaller. Furthermore, when influences of lens aberration should be suppressed, since this is an optical system that can be used together with a spherical aberration corrector which has been recently developed, the spherical aberration corrector can be newly added.

Furthermore, the specimen position of the optical system of this Embodiment 5 can be configured outside the path of magnetic flux of the objective lens, which makes it possible to provide observation conditions in a field free condition for the specimen. For this reason, through an observation of the magnetized state of a magnetic material or by adding a magnetic field application device, it is possible to observe a response to an outside magnetic field in a magnetized state in the magnetic material. Furthermore, this specimen position makes it easier to secure a large space around the specimen and thereby allows various functions to be added for an observation of the specimen. The addition of the above described magnetic field application mechanism is one example thereof. In addition, it is possible to add an analysis mechanism such as an X-ray analyzer, secondary electron analyzer, observation mechanism that changes the specimen temperature by heating or cooling, observation mechanism that causes a physical force to apply to the specimen such as compression or stretching, and thereby observe, through an interference microscope, state variations of the specimen material using these mechanisms.

Figure 15:
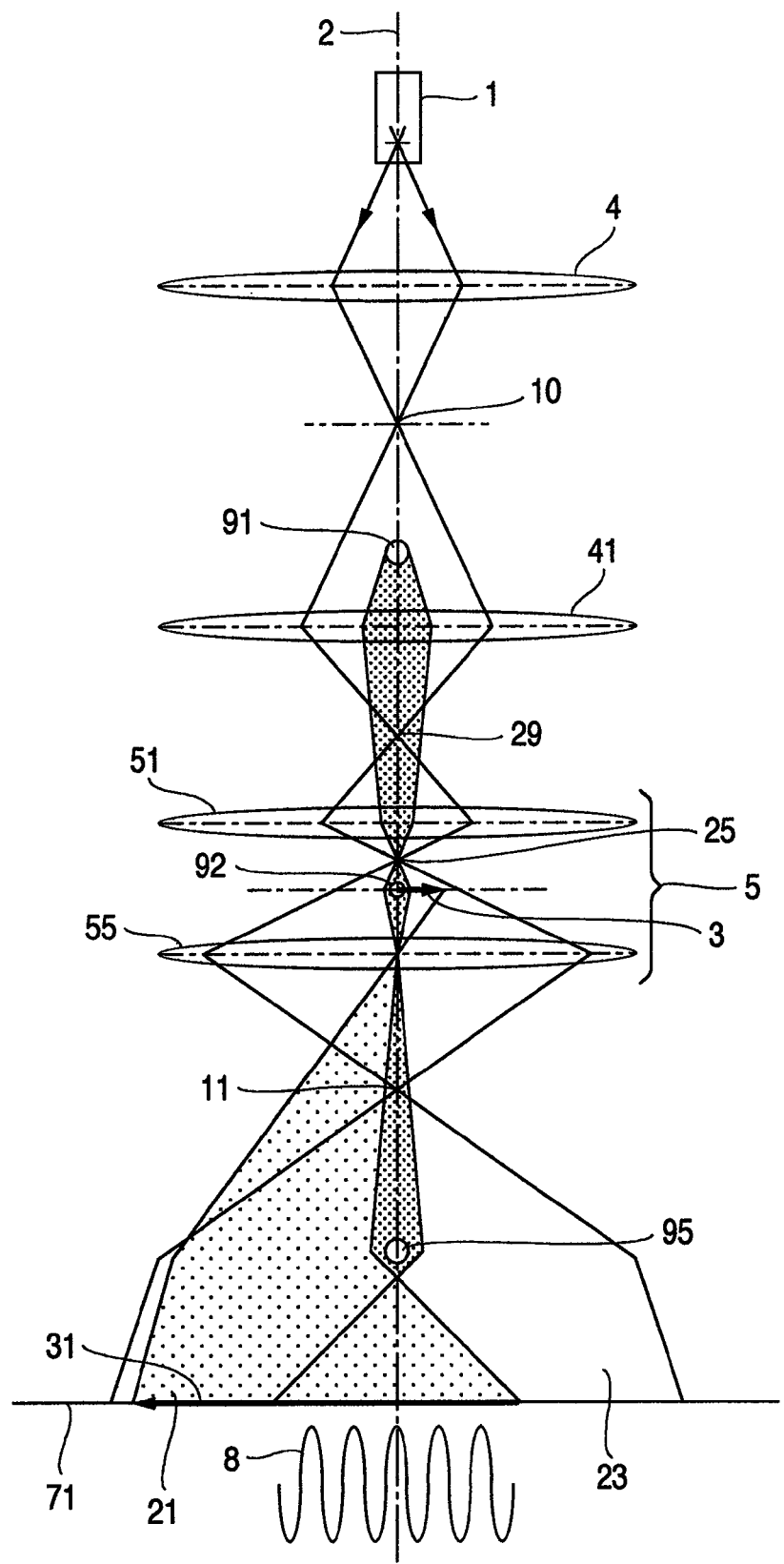
FIG. 15 is a schematic diagram showing an optical system of a double-biprism electron interferometer when another lens is additionally constructed upstream of a specimen.

Embodiment 6: Double-biprism Electron Interferometer with Another Lens Additionally Configured Upstream of Specimen FIG. 15 shows a double-biprism electron interference optical system provided with an upper electron biprism 91 and an electromagnetic lens 41 operated in association with the electron biprism upstream of a specimen in the traveling direction of an electron beam. In the optical system including both the additionally configured electromagnetic lens 41 and the aforementioned pre-field lens 51, the central filament electrode 91 of the upper electron biprism is imaged on the specimen plane 3 (image 92). In the double-biprism electron interference optical system using the pre-field lens 51 of Embodiment 1, the magnification of the central filament electrode 91 of the upper electron biprism which has been imaged in a reduced size on the specimen is mainly determined depending on the position of the upper electron biprism and the size of the projected image decreases as the upper electron biprism is located more upstream in the traveling direction of the electron beam. With one electromagnetic lens additionally configured, this embodiment is an optical system capable of securing a degree of operational flexibility with regard to the projection magnification of the specimen plane 3 of the central filament electrode 91 of the upper electron biprism. However, since the electromagnetic lens 41 is physically added, the size as the electron optical system device is greater than that of Embodiment 1. That is, this is a configuration in which the electromagnetic lens on the imaging optical system side moves to the condenser optical system.

Furthermore, the optical system (FIG. 15) of this Embodiment 6 has completely the same configuration downstream of the specimen position in the traveling direction of the electron beam as the conventional high resolution, high magnification optical system. For this reason, this configuration adds no change or interference to a high resolution observation of a crystal lattice image and allows the high resolution image observation performance of the conventional transmission electron microscope to display as is. Furthermore, compared to Embodiment 1, this embodiment has the condenser lens 41 additionally configured so as to be operable independently of the objective lens system 5 in association with the upper electron biprism 91 upstream of the specimen. Since the condenser lens 41 forms an image of the central filament electrode 91 of the upper electron biprism on the specimen plane, there are less restrictions on positions on the optical axis at which the central filament electrode 91 of the upper electron biprism is installed providing an advantage that the operator can adjust a wider range when operating an electron microscope.

The interference optical system provided with an electron biprism and an electromagnetic lens operated in association with a pre-field lens additionally configured upstream of the objective lens can also be constructed in a triple-biprism electron interferometer in the same way as in the case of Embodiment 6.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:
1. An electron beam device comprising,
an electron beam source,
a condenser optical system for irradiating an electron beam emitted from the source onto a specimen,
a specimen holder for holding the specimen irradiated with the electron beam, and
an imaging lens system for imaging the specimen,
wherein a first electron biprism is disposed downstream of the condenser optical system in a traveling direction of the electron beam on an optical axis of the electron beam device and upstream of a position at which the specimen is disposed in the traveling direction of the electron beam and a second electron biprism is disposed downstream of the first electron biprism in the traveling direction of the electron beam via the specimen and one or a plurality of lenses of the imaging lens system,
wherein the device comprises an electron optical system in which in a first electromagnetic lens located downstream of the first electron biprism in the traveling direction of the electron beam, an image of the first electron biprism is formed in a magnetic field of the first electromagnetic lens by one or a plurality of times, an image thereof is also formed on an object plane of second electromagnetic lenses and thereafter downstream of the first electromagnetic lens in the traveling direction of the electron beam, and the image forming actions are obtained in subsequent downstream lens systems, and
wherein a position of the specimen along an axis of the electron beam is identical to one image plane or one of plural image planes on each of which the image of the first electron biprism is formed.

2. The electron beam device according to claim 1, wherein the first electron biprism and the second electron biprism are arranged in respective planes perpendicular to an optical axis of the electron optical system and parallel to each other.

3. The electron beam device according to claim 1, wherein the first electron biprism and the second electron biprism are capable of changing their positions and rotating their electrodes independently of each other, and voltages are applicable independently of each other to the first electron biprism and the second electron biprism, respectively.

4. An electron beam device comprising,
an electron beam source,
a condenser optical system for irradiating an electron beam emitted from the source onto a specimen,
a specimen holder for holding the specimen irradiated with the electron beam and an imaging lens system for imaging the specimen,
wherein the specimen is disposed downstream of the condenser optical system in a traveling direction of the electron beam on an optical axis of the electron beam device and upstream of the imaging lens system in the traveling direction of the electron beam, a first electron biprism is disposed in a magnetic field of a first electromagnetic lens belonging to the imaging lens system in the traveling direction of the electron beam and a second electron biprism is disposed downstream of the first electron biprism in the traveling direction of the electron beam.

5. The electron beam device according to claim 4, wherein the device comprises an electron optical system in which in the first electromagnetic lens located downstream of the specimen in the traveling direction of the electron beam, an image of the specimen is formed in the magnetic field of the first electromagnetic lens by one or a plurality of times, the image thereof is also formed on an object plane of second electromagnetic lenses and thereafter downstream of the specimen in the traveling direction of the electron beam, and the image forming actions are obtained in subsequent downstream lens systems.

6. The electron beam device according to claim 5, wherein a position of the first electron biprism along an axis of the electron beam is identical to one image plane or one of plural image planes on each of which the image of the specimen is formed.

7. The electron beam device according to claim 4, wherein the first electron biprism and the second electron biprism are arranged in respective planes perpendicular to an optical axis of the electron optical system and parallel to each other.

8. The electron beam device according to claim 4, wherein the first electron biprism and the second electron biprism are capable of changing their positions and rotating their electrodes independently of each other, and voltages are applicable independently of each other to the first electron biprism and the second electron biprism, respectively.

* * * * *